(12) United States Patent
Qi

(10) Patent No.: US 9,397,200 B2
(45) Date of Patent: Jul. 19, 2016

(54) METHODS OF FORMING 3D DEVICES WITH DIELECTRIC ISOLATION AND A STRAINED CHANNEL REGION

(71) Applicant: GLOBALFOUNDRIES Inc., Grand Cayman (KY)

(72) Inventor: Yi Qi, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/867,800

(22) Filed: Sep. 28, 2015

(65) Prior Publication Data
US 2016/0118472 A1    Apr. 28, 2016

Related U.S. Application Data

(60) Provisional application No. 62/068,344, filed on Oct. 24, 2014.

(51) Int. Cl.
*H01L 27/01*  (2006.01)
*H01L 29/66*  (2006.01)
*H01L 29/06*  (2006.01)

(52) U.S. Cl.
CPC ........ *H01L 29/6681* (2013.01); *H01L 29/0669* (2013.01); *H01L 29/66545* (2013.01); *H01L 29/66553* (2013.01)

(58) Field of Classification Search
None
See application file for complete search history.

(56) References Cited

U.S. PATENT DOCUMENTS

| 7,560,358 | B1 | 7/2009 | Kim et al. | |
| 9,059,042 | B2 * | 6/2015 | Xie | ............... H01L 27/1211 |
| 9,064,890 | B1 * | 6/2015 | Xie | ............... H01L 21/823431 |

\* cited by examiner

*Primary Examiner* — Seahvosh Nikmanesh
(74) *Attorney, Agent, or Firm* — Amerson Law Firm, PLLC

(57) ABSTRACT

One illustrative method involves forming a FinFET device or a nanowire device by forming a sacrificial gate structure above a substantially vertically oriented structure comprised of first and second semiconductor materials, forming epi semiconductor material in the source/drain regions, removing the sacrificial gate structure so as to define a replacement gate cavity and to expose the first and second semiconductor materials within the gate cavity, performing an etching process through the replacement gate cavity to selectively remove the exposed first sacrificial semiconductor material relative to the exposed second semiconductor material so as to define a gap under the second semiconductor material within the gate cavity, filling the gap with an insulating material, and forming a replacement gate structure in the gate cavity.

21 Claims, 23 Drawing Sheets

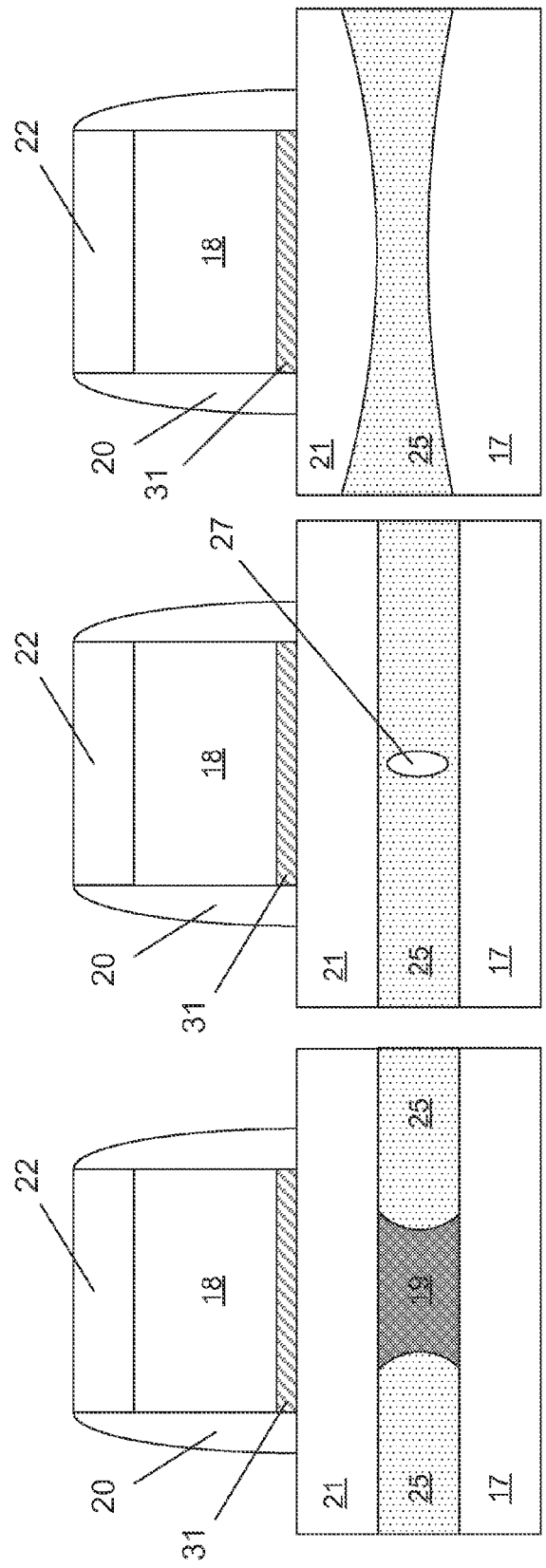

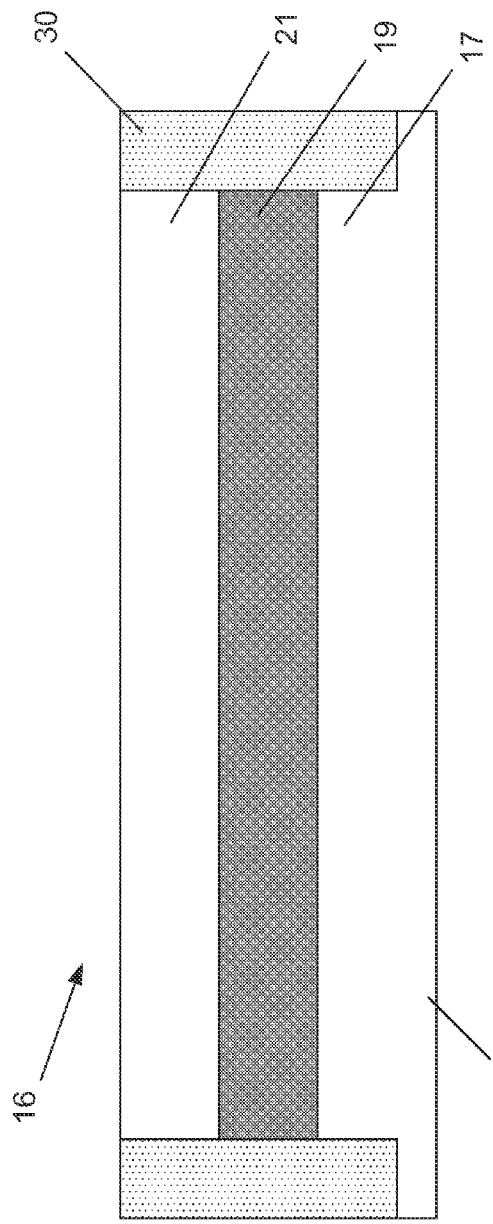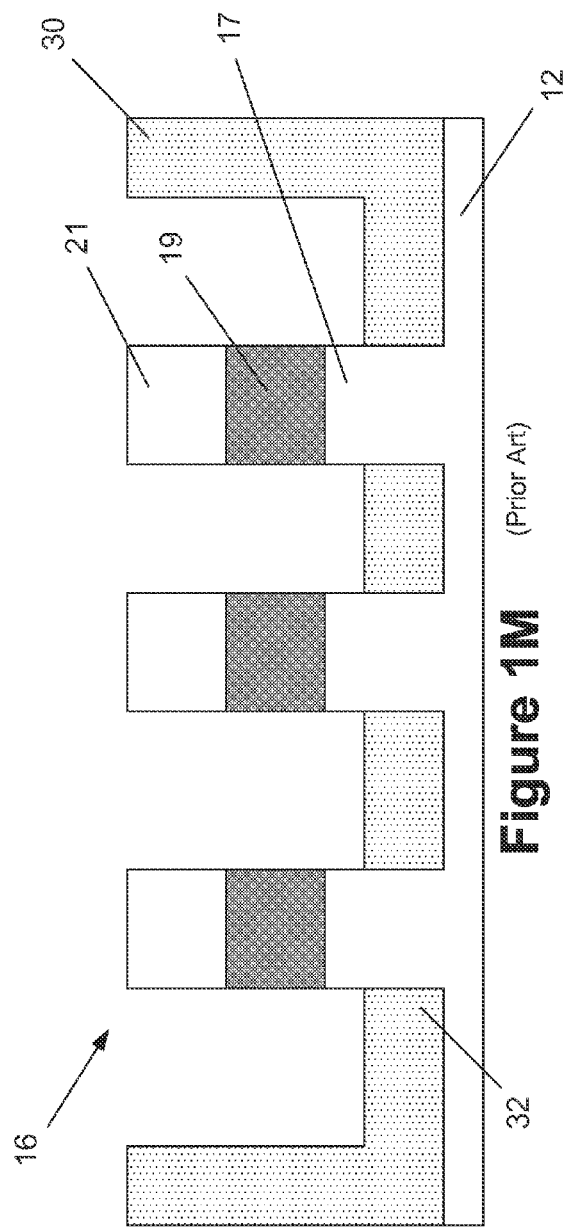
Figure 1L (Prior Art)
Figure 1M (Prior Art)

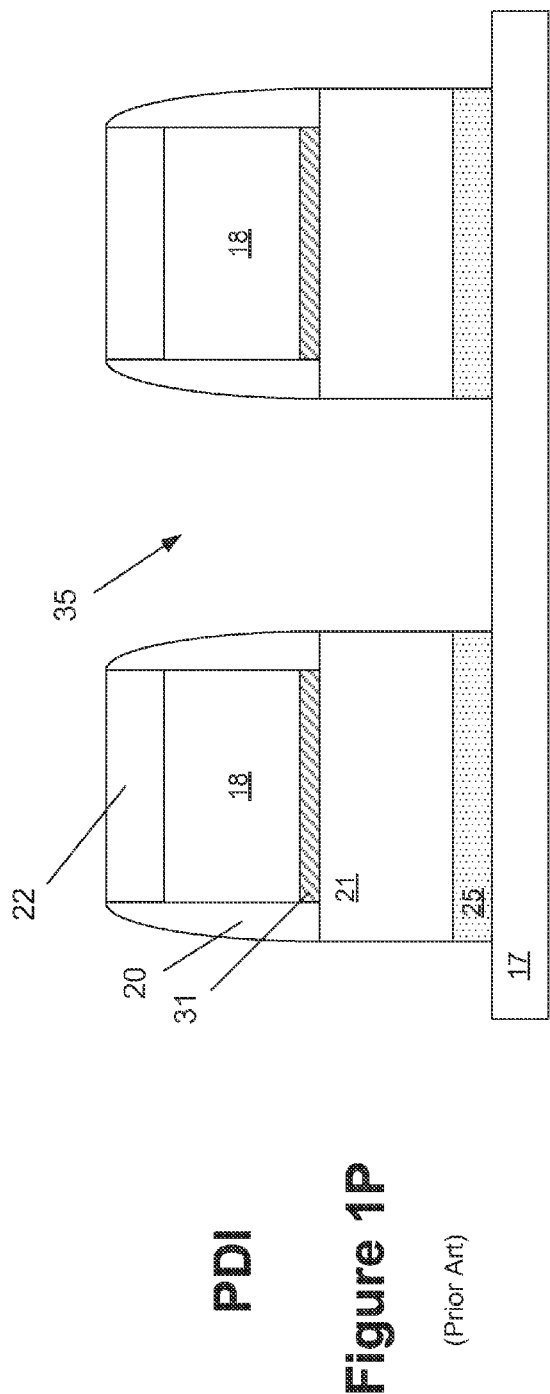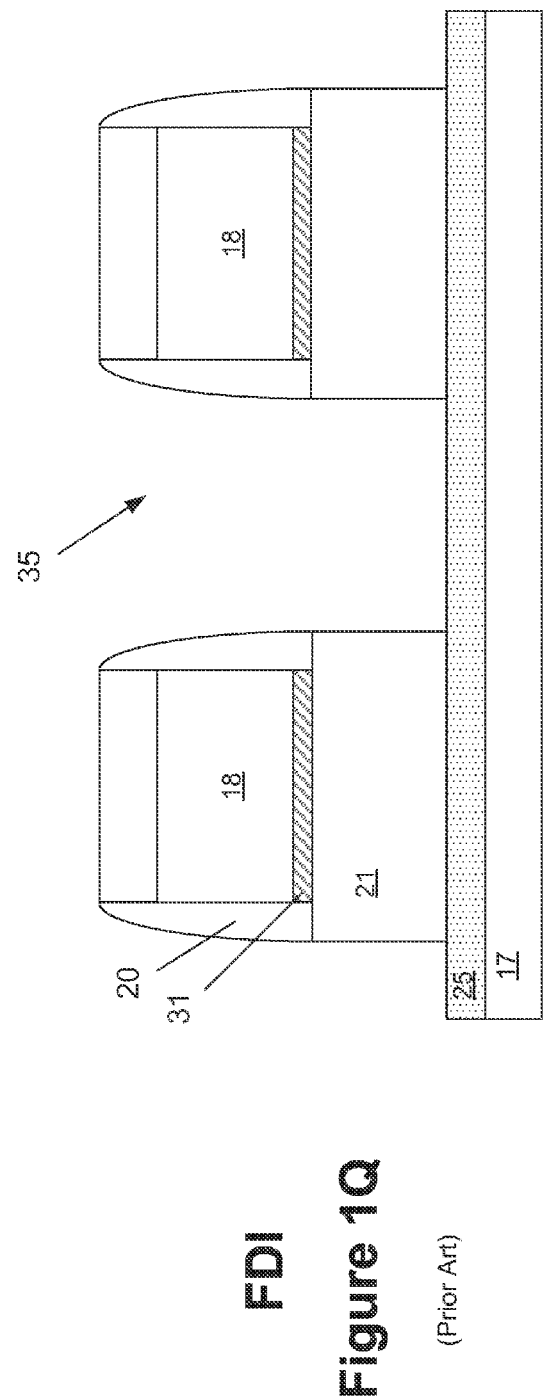
PDI
Figure 1P
(Prior Art)
FDI
Figure 1Q
(Prior Art)

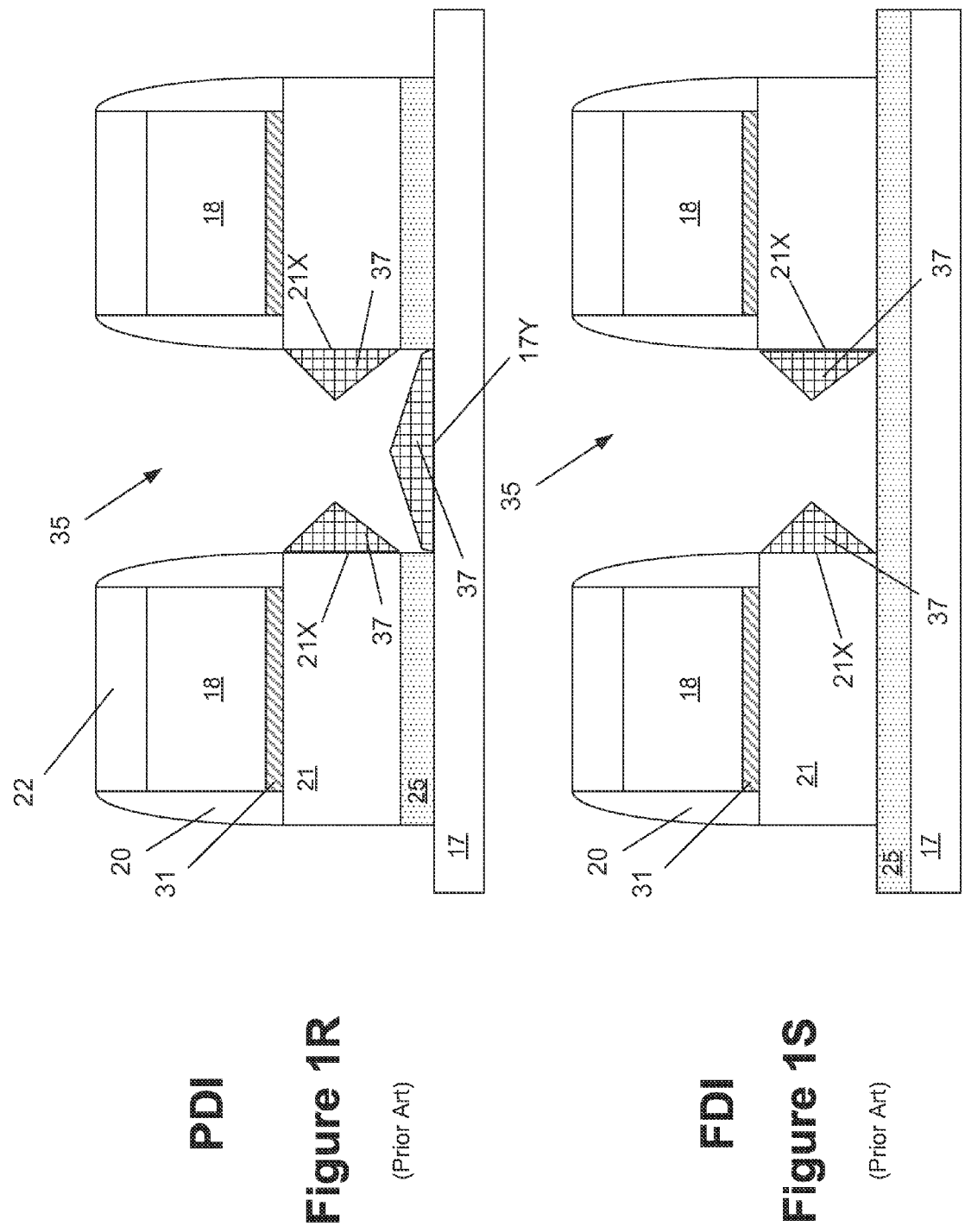

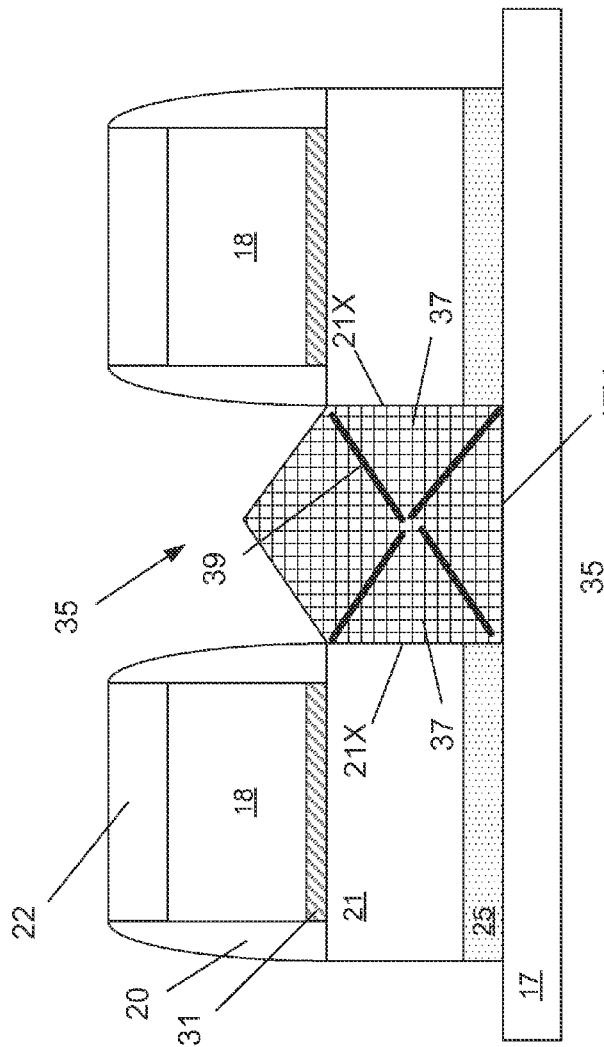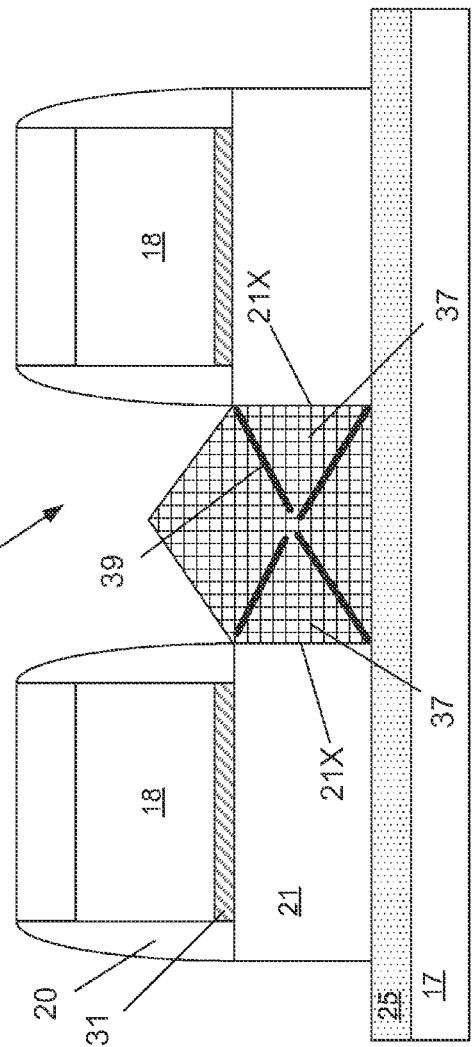
PDI
Figure 1T
(Prior Art)
FDI
Figure 1U
(Prior Art)

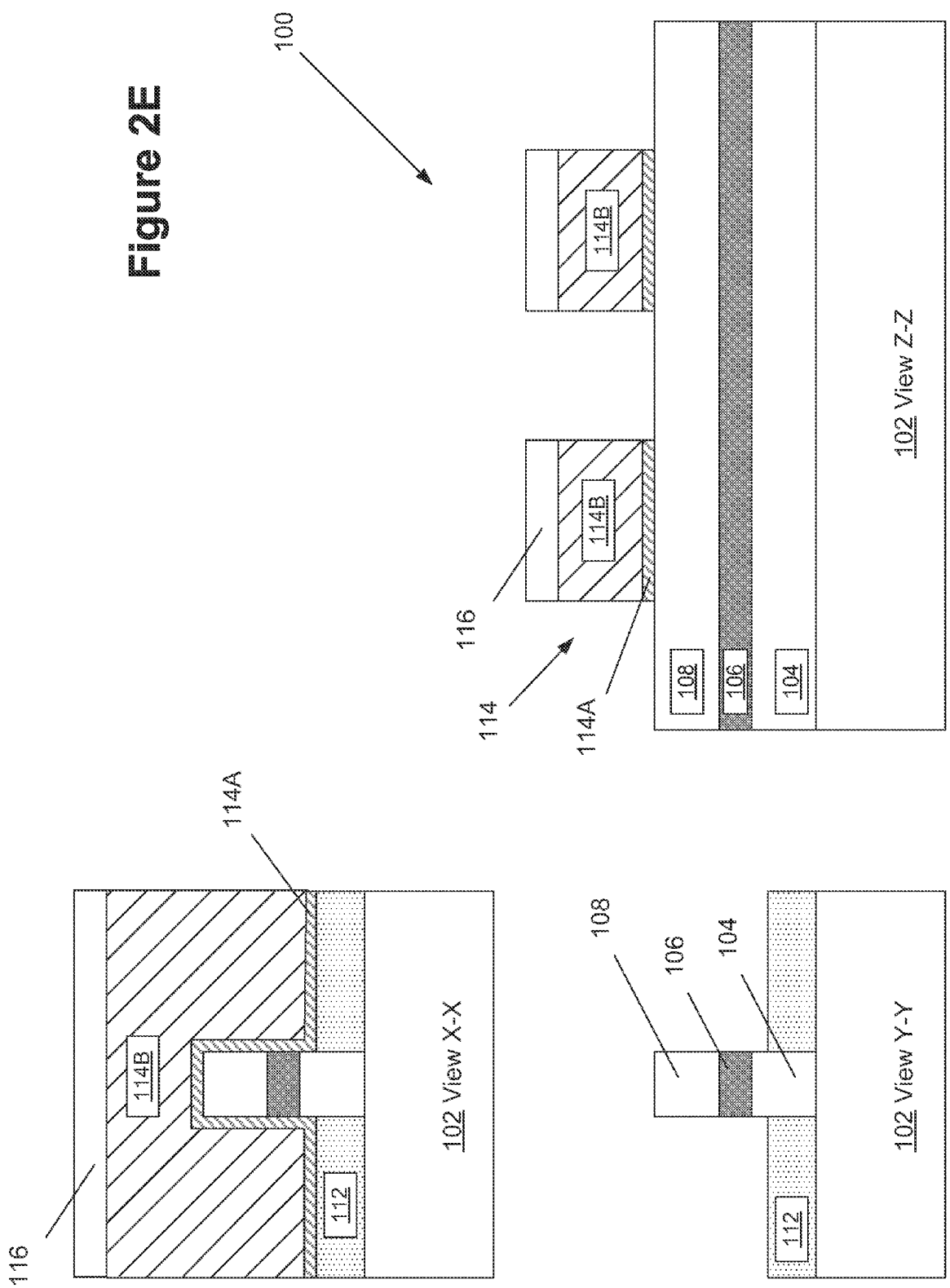

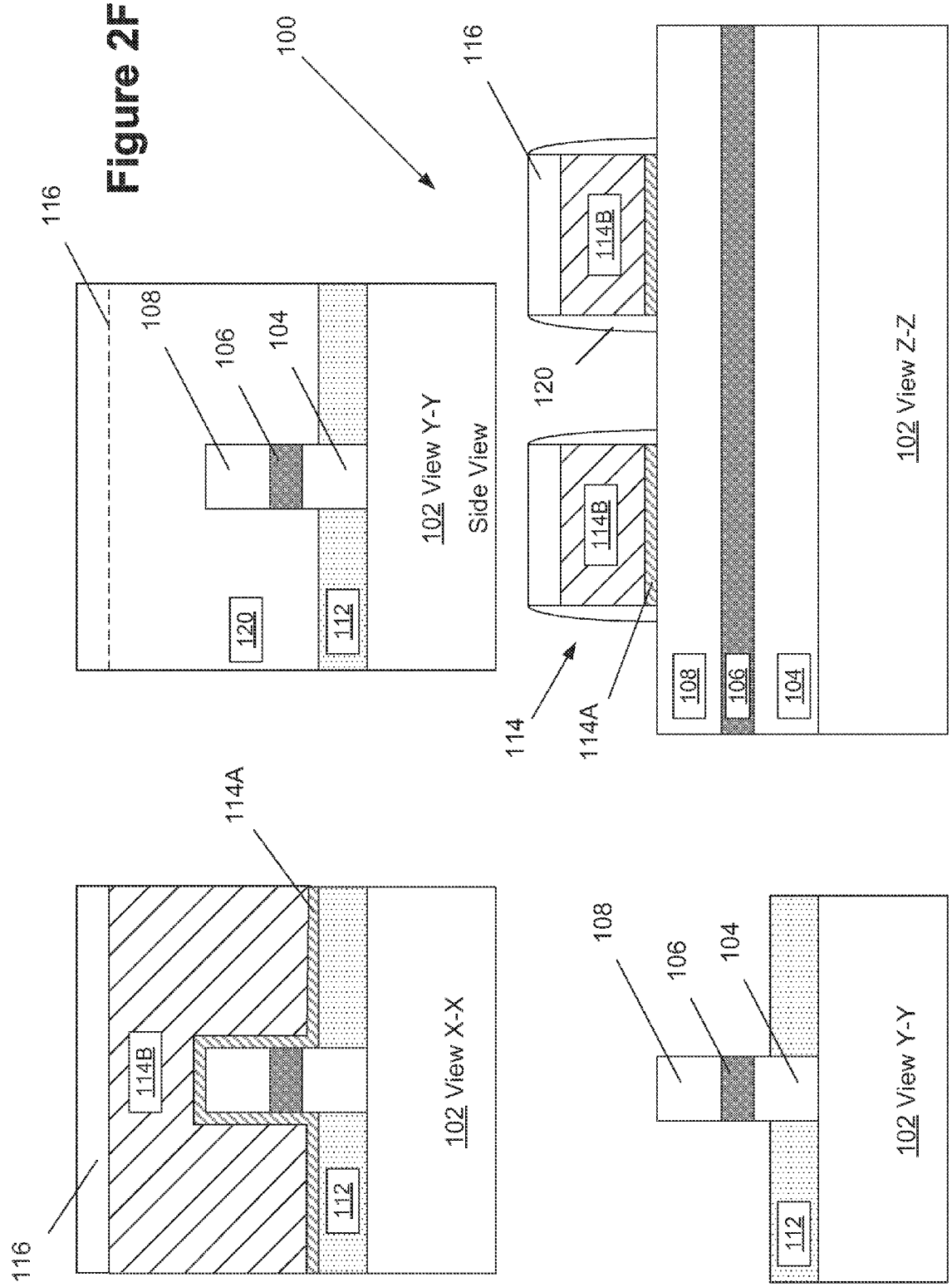

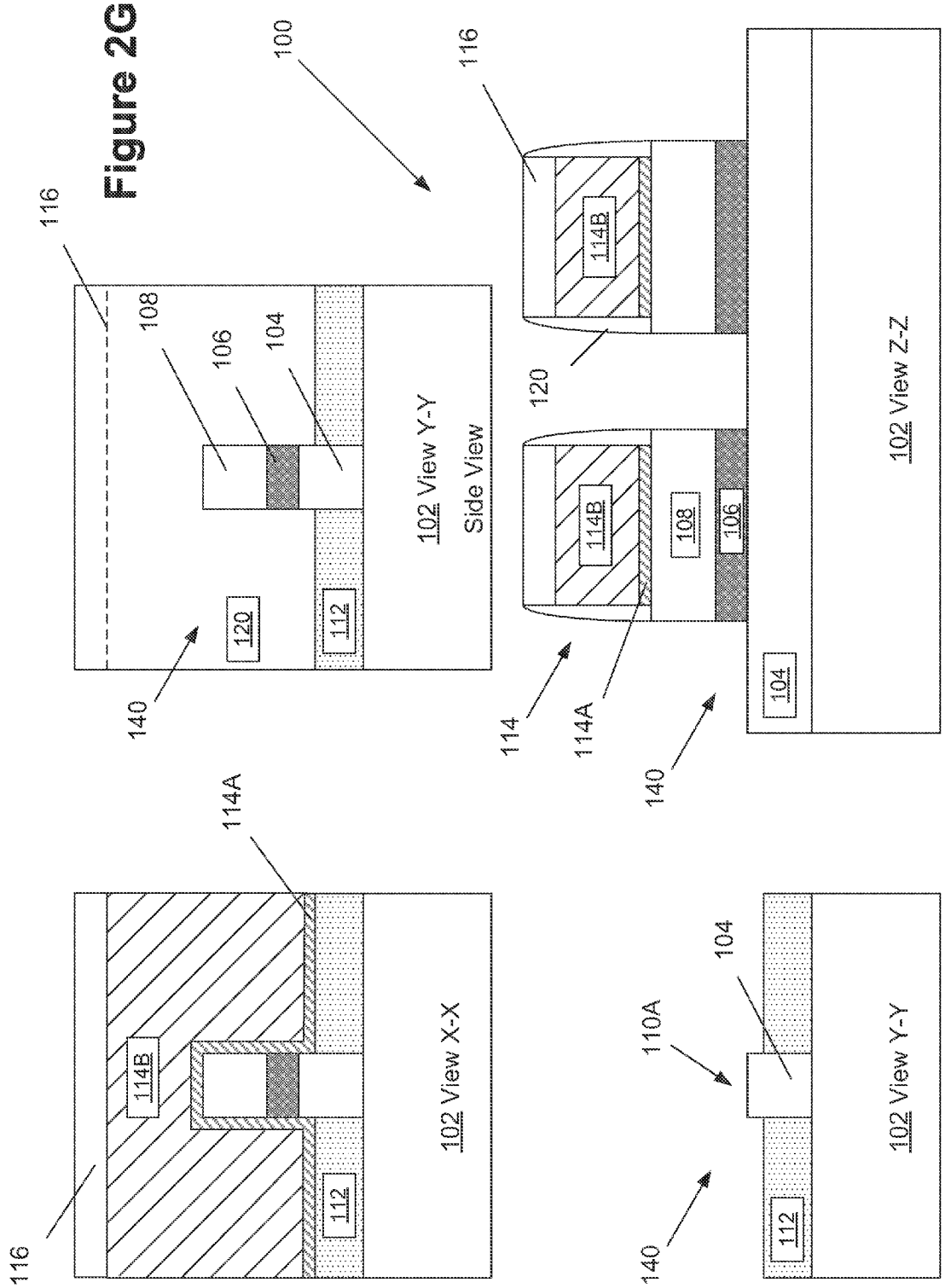

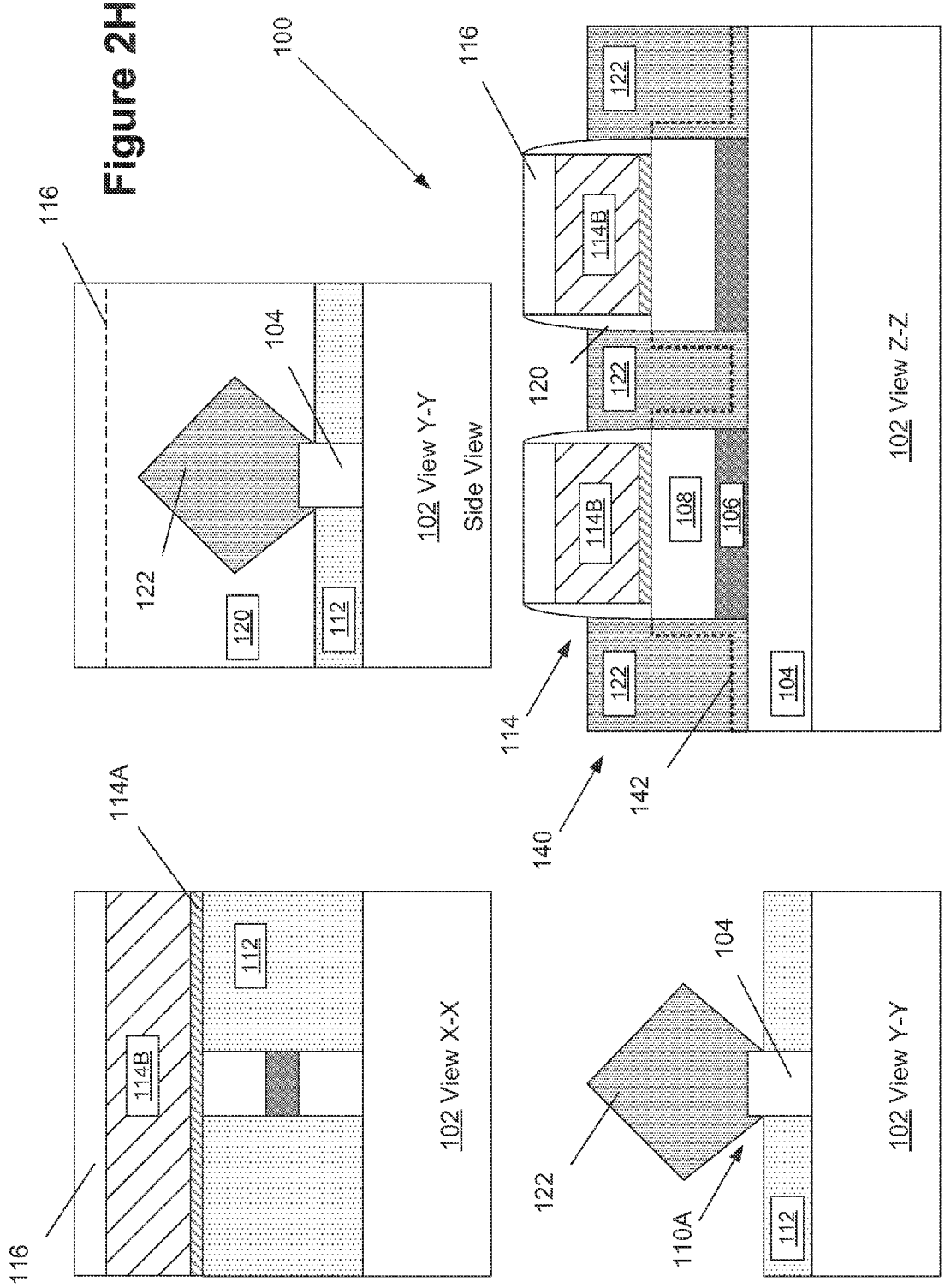

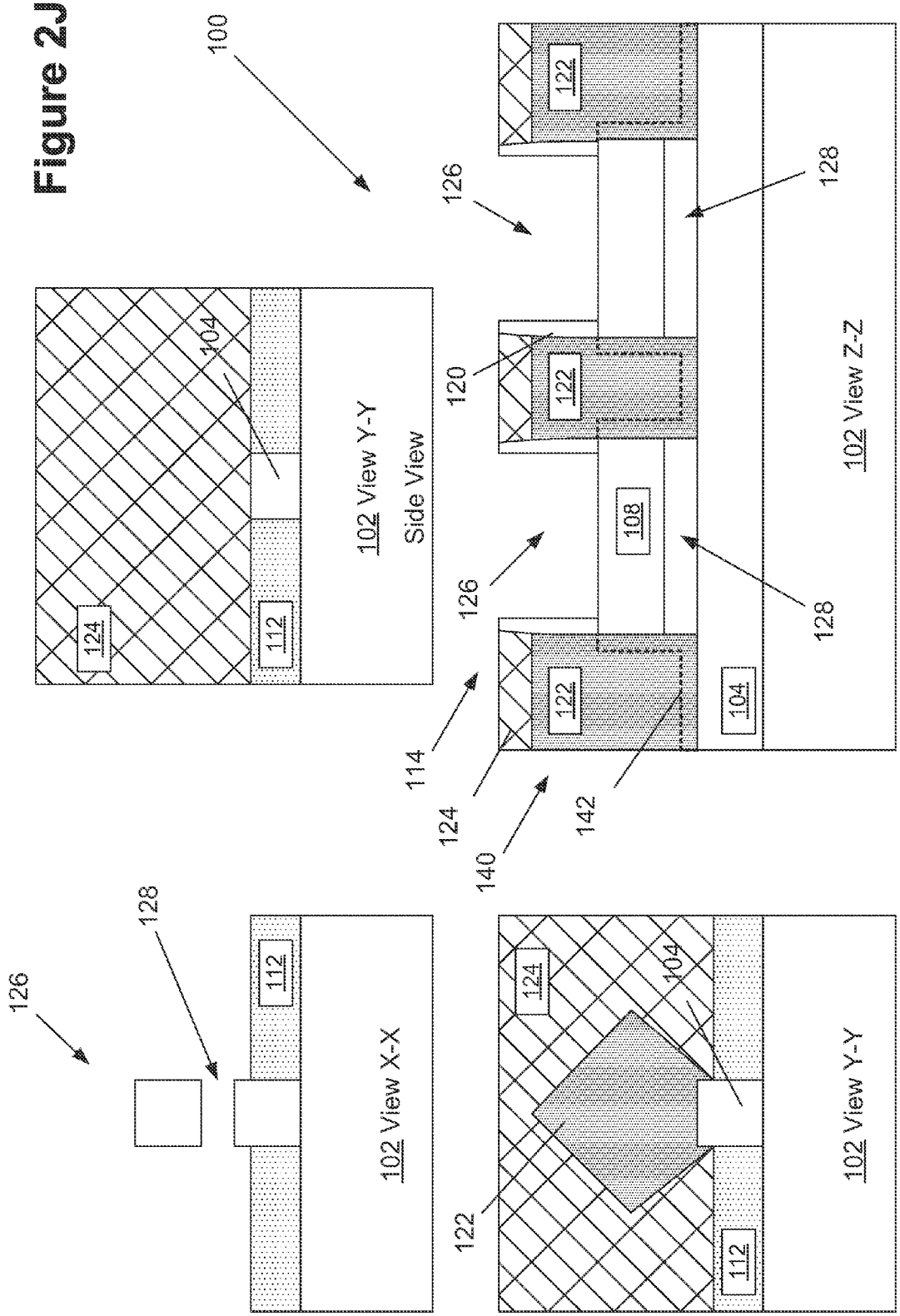

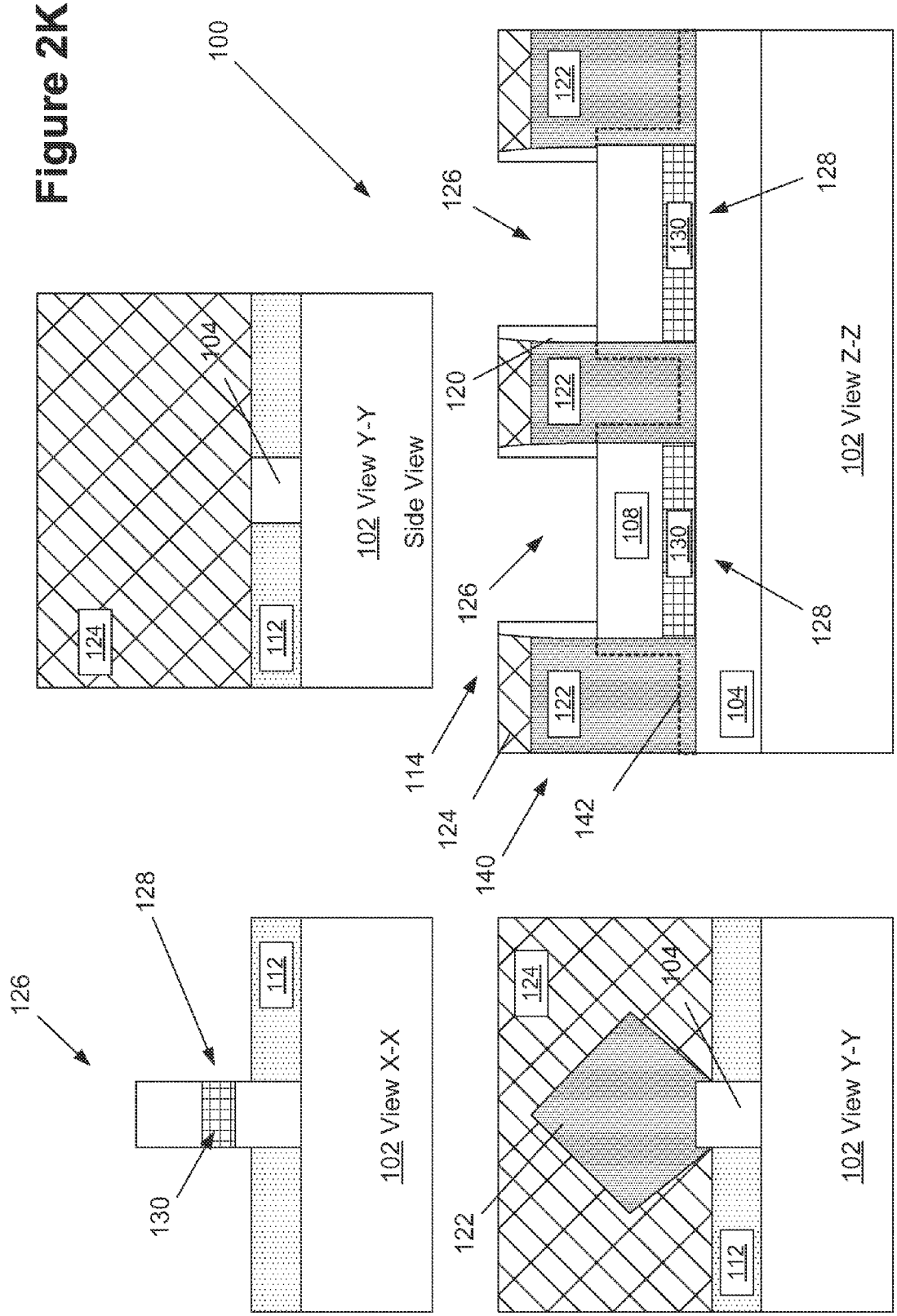

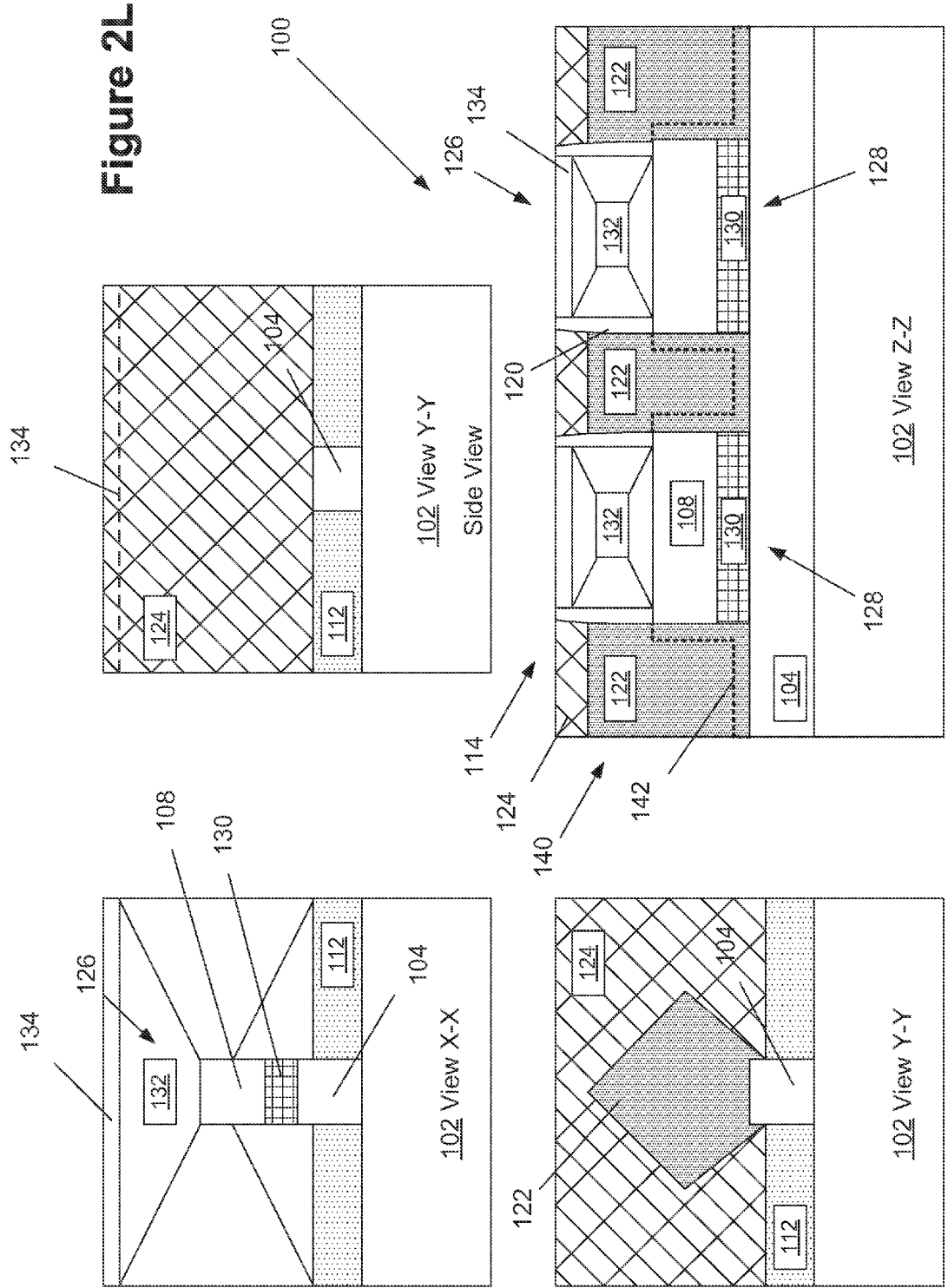

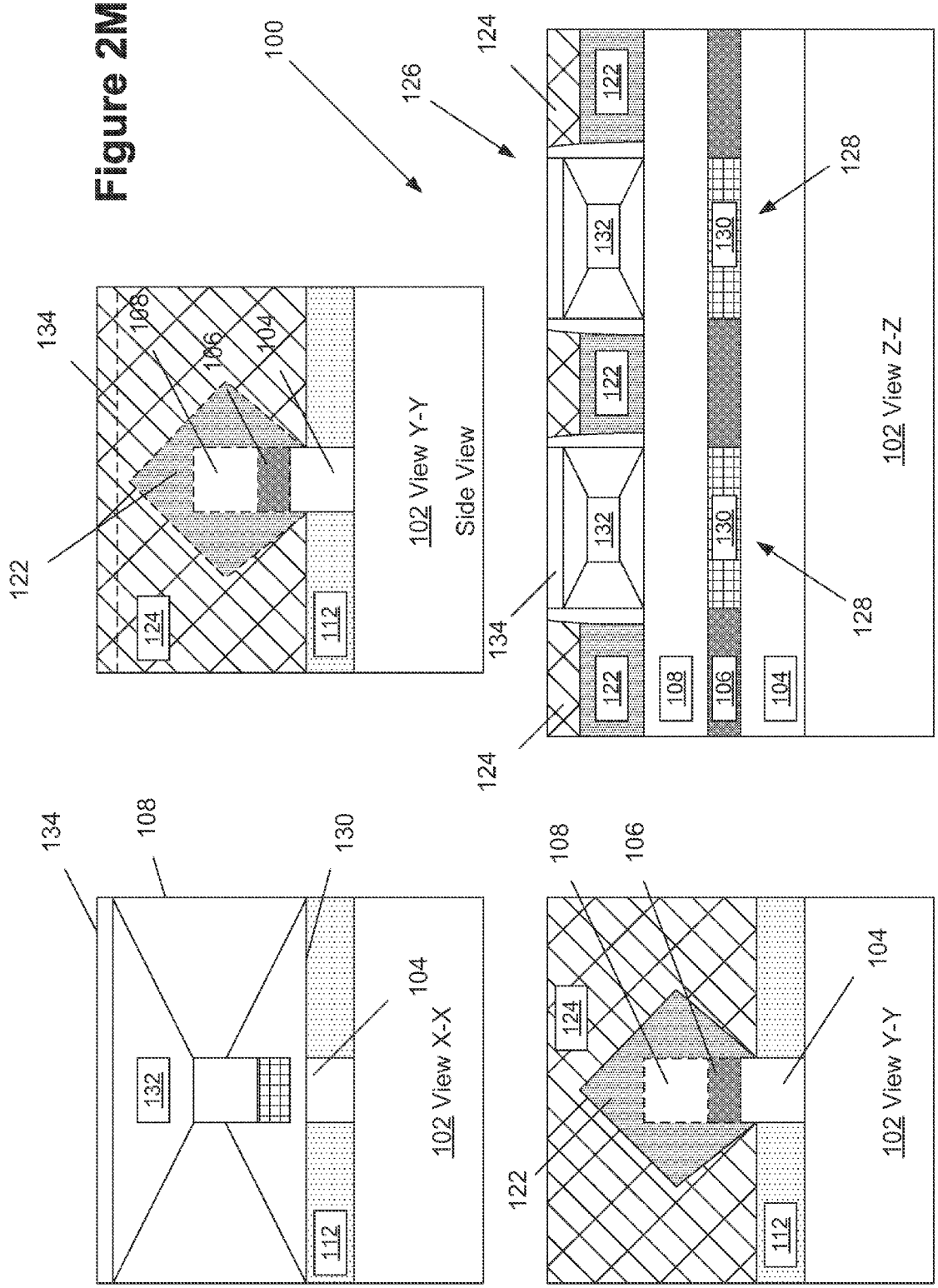

METHODS OF FORMING 3D DEVICES WITH DIELECTRIC ISOLATION AND A STRAINED CHANNEL REGION

BACKGROUND OF THE INVENTION

1. Field of the Invention

Generally, the present disclosure relates to the manufacture of FET semiconductor devices, and, more specifically, to various methods of forming a three-dimensional (3D) semiconductor device, such as a dielectrically isolated FinFET device or a nanowire device, with a strained channel region.

2. Description of the Related Art

The fabrication of advanced integrated circuits typically involves the formation of a large number of field effect transistors (MOSFETs or FETs). For at least 7 nm technology nodes, a number of device options have been considered for forming transistors, e.g., 3D devices such as FinFET devices with dielectric isolation for improved short channel performance and low leakage currents as well as nanowire devices to further reduce short channel effects, etc. It is also known in the art that the performance of a transistor can be improved if the channel region of the device can be appropriately strained. More particularly, the performance of PFET devices and NFET devices is improved if the channel region of such devices is subjected to a compressive or tensile strain, respectively. Such strain may be applied using source and drain epitaxy materials, such as a SiC stressor material for an NFET device and a SiGe stressor material for a PFET device. In addition, strain may be applied to the channel region via the substrate, e.g., a SiGe channel material can be strained relative to a silicon substrate, and silicon channel material can be strained relative to a SiGe substrate or a SiGe strain relaxed buffer layer or structure. As it relates to the formation of 3D devices, there are several problems associated with various prior art techniques of forming such devices with appropriate dielectric isolation and strained channel regions.

FIGS. 1A-1F reflect a prior art FinFET device 10 with bottom dielectric isolation. FIG. 1A is a perspective view of an illustrative prior art FinFET semiconductor device 10 that is formed on top of a semiconductor substrate 12 at an intermediate point during fabrication. FIG. 1B is a cross-sectional view of the channel region of the device 10 taken through one of the fins. In this example, the FinFET device 10 includes a plurality of trenches 14 that define three illustrative fin-type structures 16, a trench isolation material 15, a gate structure 18, a gate insulation material 31, sidewall spacers 20 and a gate cap layer 22. In general, the fin-type structure 16, at this point in the process flow, is comprised of a substrate portion 17, a sacrificial portion 19 and what will become the final fin 21 for the device 10. The final fins 21 have a three-dimensional configuration: a height H, a width W and an axial length L. In this embodiment, the substrate portion 17 is made of the substrate material (such as silicon, silicon germanium or a strain relaxed buffer (SRB) layer), the sacrificial portion 19 may be made of, for example, silicon germanium (if the desired final fin 21 is to be made of silicon), and the final fin 21 that will function as the channel region of the device may be made of a material such as silicon for an NFET device and SiGe for a PFET device. The fin-type structure 16 having the three-part structure depicted in FIG. 1A may be formed using several well-known processing techniques. One such technique involves recessing an initial fin structure (i.e., the substrate portion 17) and thereafter performing two epi deposition processes to form the second and third portions 19 and 21. Alternatively, such a three-part fin-type structure 16 may be formed by performing one or more blanket-epitaxial growth processes to grow the various layers of material corresponding to the sacrificial portion 19 and the final fins 21 on the substrate 12, followed by performing an etching process through a patterned masking layer (not shown) to define the three-part fin-type structure 16 shown in FIG. 1A. As noted above, the portions of the final fins 21 covered by the dummy gate structure 18 are the channel regions of the FinFET device 10. In FIGS. 1A and 1B, the substrate material 12 (the portion 17) may have a different lattice parameter or lattice constant than that of the material of final fins 21. In such a case, the vertical thickness of final fins 21 will be less than a critical thickness of the material of the final fins 21 so as not to cause relaxation of the material of the final fin 21. In other words, the final fins 21 inherit the same lateral lattice parameter as the substrate 12 (i.e., the portion 17) and they are in a strained condition.

As indicated above, the second portion 19 of the overall fin-type structure 16 is sacrificial in nature. One problem encountered in forming such FinFET and nanowire devices is how to support the final fins 21 after the sacrificial material 19 is removed while still maintaining the desired strain on the fins 21. In one technique, the gate structures are used to support the fins 21/maintain strain when the sacrificial portions 19 are removed. FIGS. 1C-1D depict the device 10 after a selective etching process was performed to remove the second portion 19 relative to the first and third portions 17 and 21 of the overall fin-type structure 16 and from underneath the gate structure, thereby leaving a gap 23. After the sacrificial portion 19 is removed, the final fins 21, (that includes the channel region of the device) are supported by the gate structure. As noted above, the support by the gate structure is intended to maintain the strain that was initially generated in the final fins 21 via the substrate portions 17, i.e., the substrate 12.

Using the "gate-support" technique, the gap 23 has to be filled with an insulating material. Accordingly, as shown in FIGS. 1E-1F, a conformal deposition process was performed to fill the gap 23 with additional isolation material 25 (e.g., silicon dioxide). In theory, as shown in FIG. 1F, the gap 23 under the gate structure is completely filled with isolation material 25. However, in practice, such complete filling does not always occur. FIG. 1G depicts a situation where the sacrificial portion 19 was not completely removed from underneath the gate structure of the device. As a result, the channel region of the device will not be fully isolated from the substrate. FIG. 1H depicts a situation wherein, even though the sacrificial portion 19 was completely removed, an illustrative void 27 was created in the isolation material 25 when the gap 23 was filled. This occurs, in part, due to the fact that isolation material 25 has to fill the tunnel-like gap 23 under the gate structure. The presence of such voids 27 is detrimental to the isolation function to be provided by the isolation material 25. FIG. 1J depicts a situation where there may be an undesirable consumption of the final fins 21, especially in the areas laterally outside of the gate structure. That is, during the etching process that is performed to remove the sacrificial portion 19 from under the gate structure, an undesirable amount of the final fins 21 may be consumed. Such problems may especially occur when forming both long-channel and short-channel devices on the same substrate. For example, the duration of the etching process that is performed to remove the sacrificial portion 19 may be relatively long to insure complete removal of the sacrificial portion 19 (the situation depicted in FIG. 1G) on the long-channel devices. However, the short-channel devices are also subjected to this longer-duration etching process, which may result in the unwanted consumption of the final fins 21 on the short-channel devices, as reflected in FIG. 1J.

In another technique, the sacrificial material 19 is removed prior to the formation of the gate structures. Using this technique, isolation materials are used to support the fins 21/maintain strain when the sacrificial portions 19 are removed. Such an "isolation-support" technique is depicted in FIGS. 1K-1O. FIG. 1K is a plan view of the product, and FIGS. 1L-1O are cross-sectional side views taken where indicated in FIG. 1K. As shown, three illustrative overall fin-type structures 16 are formed above the substrate 12 and isolated by forming a recessed layer of insulating material 32 that is surrounded by a thicker layer of insulating material 30. See FIGS. 1L and 1M. FIGS. 1N and 1O depict the product after the sacrificial second portions 19 were removed. Note, in this embodiment, the sacrificial portions 19 of the fin-type structures 16 were removed prior to the formation of any gate structures. Thus, the removal of the sacrificial portions 19 is easier using this technique since the etchant materials do not have to "tunnel under" a gate structure. However, at the completion of this process, the relatively long final fins 21 are only supported at their ends by the thicker insulation material 30, at the locations indicated in the dashed-line regions 31 in FIG. 1N. Using this technique, it is intended that the insulation material 30 maintains the strain on the final fins 21 until such time as gate structures are formed on the relatively long final fins 21.

An additional problem that that may be encountered when forming FinFET devices with dielectric isolation is related to the formation of epitaxial semiconductor materials in recessed source/drain regions of such devices. FIGS. 1P-1S depict cross-sectional views of two illustrative gate structures wherein an etching process has been performed to define a cavity 35 where epi semiconductor material will be grown for the source/drain regions for the transistor devices. For illustration convenience, the drawings only depict the scenario wherein the portions of the final fins 21 in the source/drain regions are recessed. However, in other applications, the portions of the final fins 21 in the source/drain region may not be recessed, and the source/drain epi semiconductor materials (not shown) may be grown on the portions of the final fins 21 in the source/drain regions in the form of a cladding material. FIGS. 1P, 1R and 1T depict what is commonly referred to as a partially isolated device (Partial Dielectric Isolation), while FIGS. 1Q, 1S and 1T depict what is commonly referred to as a fully isolated device (Full Dielectric Isolation). The primary difference between the two configurations is that, in the FDI devices, the isolation material 25 is positioned under the source/drain regions, i.e., under the cavities 35, while the isolation material 25 is not present under the source/drain regions (i.e., under the cavities 35) for the PDI devices. Thus, in the PDI devices, the substrate portion 17 is exposed in the bottom of the cavity 35, whereas the isolation material 25 is exposed in the bottom of the cavity 35 for the FDI devices. Such configurations have implications when the epi semiconductor material is formed in the cavities 35 for the source/drain regions for the devices.

FIGS. 1R and 1S depict the devices at a point in time when the process of growing epitaxial semiconductor material 37 in the cavities 35 has started but are not complete. As shown in FIG. 1R, for the PDI devices wherein the substrate portion 17 is exposed in the cavity 35, the growth of epi semiconductor material 37 proceeds from three directions, i.e., the two side surfaces 21X of the final fins 21 and the upper surface 17Y of the substrate portion 17. In contrast, as shown in FIG. 1S, for the FDI devices wherein the isolation material 25 is exposed in the cavity 35, the growth of the epi semiconductor material 37 proceeds from only two directions, i.e., the two side surfaces 21X of the final fins 21. In either case, there is a dielectric surface and multiple crystalline surfaces exposed in the cavity 35.

FIGS. 1T and 1U depict the devices at a point in time when the process of growing epitaxial semiconductor material 37 in the cavities 35 is complete. Due to the growth originating on multiple crystalline surfaces, simplistically depicted defects 39, such as twin defects and stacking faults, are typically present in the final epi material for the source/drain regions due to the interaction when two or more epi growth fronts merge so as to fill the cavities 35. The presence of such defects 39 may undesirably reduce or eliminate the strain that is intended to be imparted to the channel region by the source/drain epi semiconductor material formed in the cavities 35.

The present disclosure is directed to various methods of forming a three-dimensional semiconductor device, such as a FinFET device or a nanowire device, with dielectric isolation and a strained channel region that may reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a three-dimensional semiconductor device, such as a FinFET device or a nanowire device, with dielectric isolation and a strained channel region. One illustrative method disclosed herein includes, among other things, forming a sacrificial gate structure above a substantially vertically oriented structure, the structure comprising a first sacrificial semiconductor material and a second semiconductor material positioned above the first semiconductor material, forming a sidewall spacer adjacent the sacrificial gate structure, after forming the sidewall spacer, forming epi semiconductor material in the source/drain regions and performing at least one etching process to remove the sacrificial gate structure so as to define a replacement gate cavity and to expose the first and second semiconductor materials within the gate cavity. In this embodiment, the method further includes the steps of, with the epi semiconductor material in position in the source/drain regions, performing an etching process through the replacement gate cavity to selectively remove the exposed first semiconductor material within the gate cavity relative to the exposed second semiconductor material so as to define a gap under the second semiconductor material within the gate cavity, filling the gap with an insulating material and forming a replacement gate structure in the gate cavity around at least a portion of the second semiconductor material. The ultimate device may be a FinFET device or a nanowire device.

BRIEF DESCRIPTION OF THE DRAWINGS

The disclosure may be understood by reference to the following description taken in conjunction with the accompanying drawings, in which like reference numerals identify like elements, and in which:

FIGS. 1A-1H and 1J-1U depict various prior art techniques for forming strained 3D devices and some of the problems associated therewith; and FIGS. 2A-2M depict various illustrative methods disclosed herein of forming a three-dimensional semiconductor device, such as a FinFET device or a nanowire device with dielectric isolation and a strained channel region.

Figure 1B:
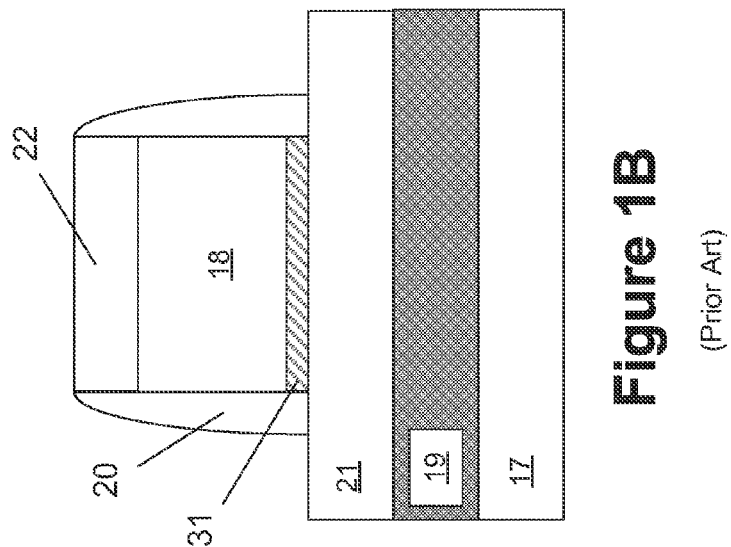
Figure 1A:
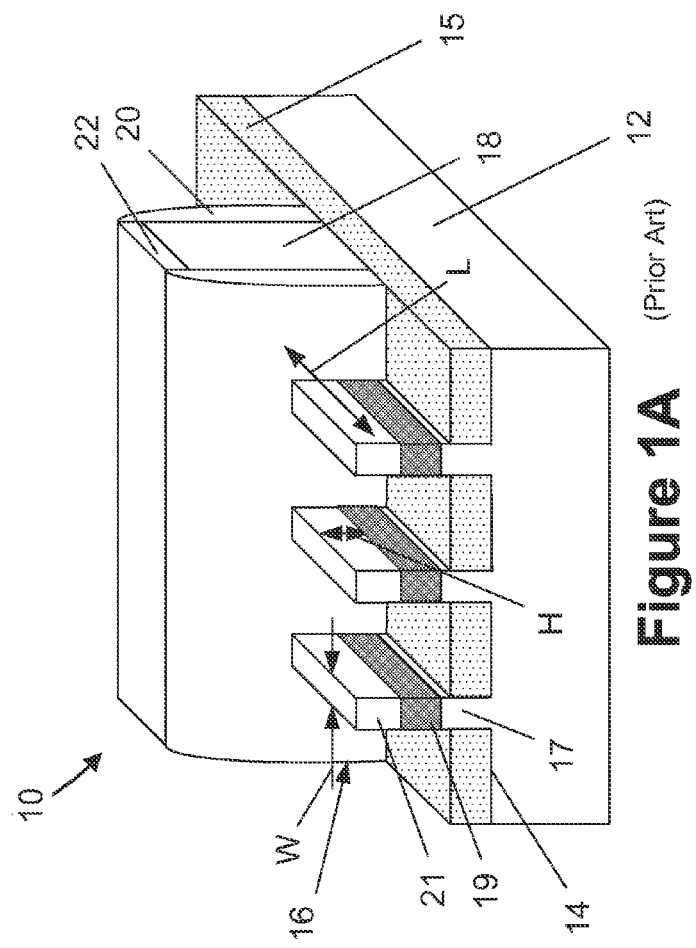

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a three-dimensional semiconductor device, such as a FinFET device or a nanowire device, with dielectric isolation and a strained channel region. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

In one embodiment, the illustrative FinFET or nanowire device 100 will be formed in and above the semiconductor substrate 102 made of silicon having an illustrative bulk configuration. Of course, the substrate 102 may be comprised of materials other than silicon such as a SiGe strain relaxed buffer ("virtual substrate"). Thus, the terms "substrate" or "semiconductor substrate" should be understood to cover all semiconducting materials and all forms of such materials. The FinFET or nanowire device 100 may be either an NMOS or a PMOS transistor. The gate structure of the device 100 may be formed using so-called "gate-first" or "replacement gate" ("gate-last") techniques. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the FinFET or nanowire device 100 disclosed herein may be formed using a variety of different materials and by performing a variety of known techniques, e.g., a chemical vapor deposition (CVD) process, an atomic layer deposition (ALD) process, a thermal growth process, epi growth processes, spin-coating techniques, etc. The thicknesses of these various layers of material may also vary depending upon the particular application.

Figure 2A:
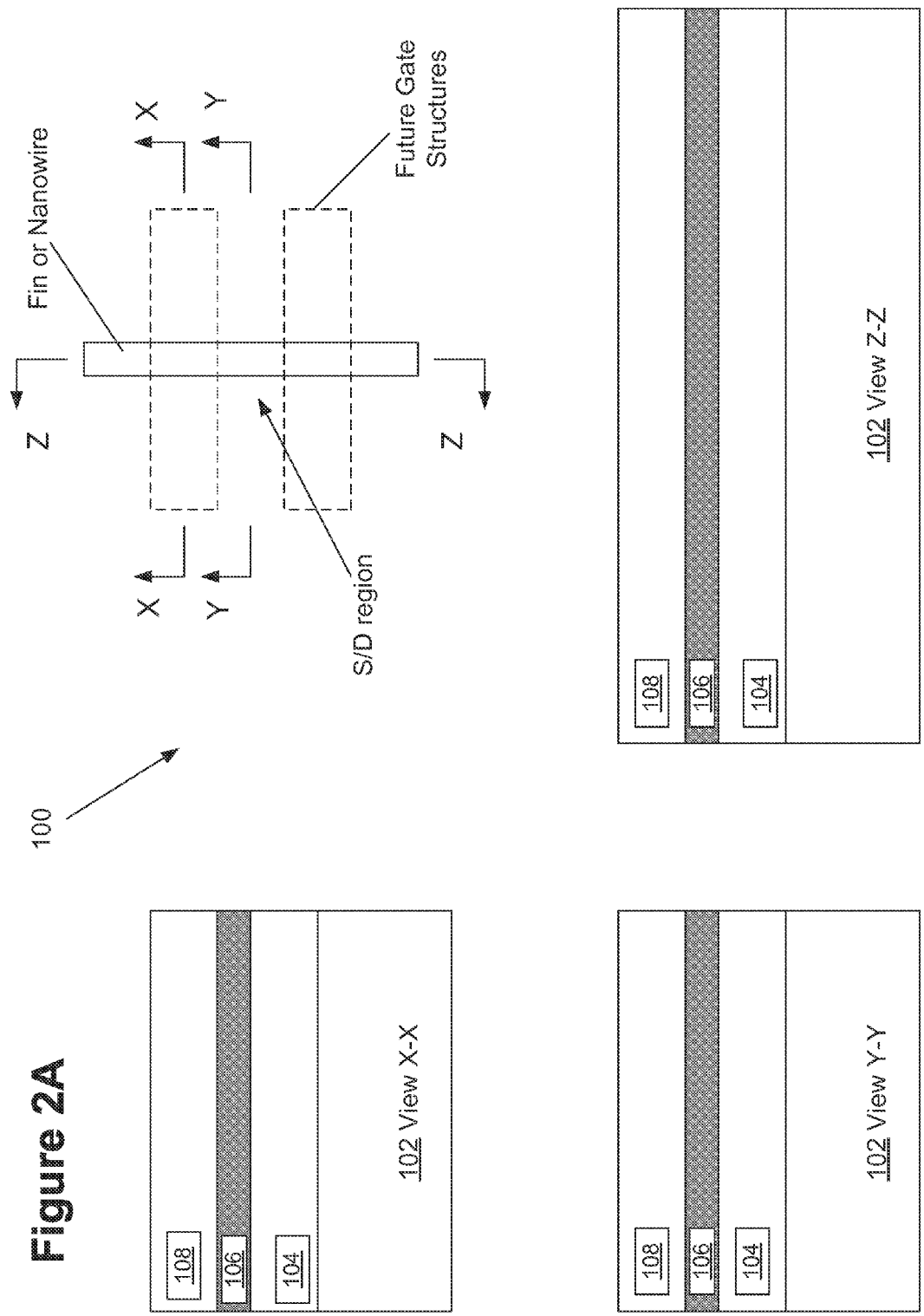

FIG. 2A contains a simplistic plan drawing of the device in the upper right corner. In the embodiment disclosed herein, the FinFET or nanowire device 100 will be disclosed in the context of forming a single vertically oriented structure and two illustrative gate structures. Of course, the device disclosed herein may be formed with any desired number of vertically oriented structures. The plan view in FIG. 2A also depicts where various cross-sectional views are taken in the drawings. More specifically, the view "X-X" is a cross-sectional view taken through a gate structure in a gate-width (GW) of the device; the view "Y-Y" is a cross-sectional view taken through the source/drain region of the device in a direction parallel to the gate-width direction; and the view "Z-Z" is a cross-sectional view taken through the long axis of the vertically oriented structure in what will become the gate-length (GL) direction, i.e., in a current transport direction of the device when it is completed.

FIG. 2A depicts the FinFET or nanowire device 100 after several process operations were performed. More specifically, an optional first layer of semiconductor material 104, a sacrificial second layer of semiconductor material 106 and a channel semiconductor material third layer 108 were formed above the substrate 102. In general, the sacrificial second layer 106 should be made of a semiconductor material that may be selectively removed by etching relative to the semiconductor material(s) of the first optional layer 104 (when present) and the third channel material layer 108. The first and third layers 104, 108 need not be made of the same semiconductor materials, although that situation may occur in some applications. In one illustrative embodiment where the FinFET or nanowire device 100 is an NFET device, the substrate 102 may be a strain relaxed buffer (SRB) silicon germanium material ($SiGe_{0.25}$), the first optional layer 104 and the third channel material layer 108 may be made of silicon, while the sacrificial second layer 106 of semiconductor material may be made of silicon-germanium ($SiGe_{0.50}$). In another embodiment where the FinFET or nanowire device 100 is a PFET device, the substrate 102 may be a strain relaxed buffer (SRB) silicon germanium material ($SiGe_{0.25}$), the first optional layer 104 and third channel material layer 108 may be made of silicon germanium ($SiGe_{0.5}$), while the second sacrificial layer 106 of semiconductor material may be made of silicon. As will be appreciated by those skilled in the art after a complete reading of the present application, the above-identified materials for the layers 104, 106, 108 are simply examples that may be used in some applications. In practice, the composition of the layers 104, 106 and 108 are selected and formed so as to impart a desired strain to the film stack comprising the layers 104, 106 and 108. The composition of the layers 104, 106 and 108 are also selected so as to achieve a desired etch selectivity between the sacrificial second layer 106 and the other layers of material. The manner in which that is accomplished is well known to those skilled in the art. The thicknesses of each of the individual layers 104, 106, 108 should have a thickness less than a critical thickness of that material so as to not cause relaxation and to insure that the overall stack of materials is in a strained condition. The layers 104, 106 and 108 may be formed by performing known epitaxial deposition processes. As noted above, the device may be either a FinFET device or a nanowire device. In the case of a nanowire device, the depicted device would have a single nanowire. However, if more nanowires are desired, additional layers of semiconductor materials may be formed above the layer 108. For example, for a two-wire nanowire device, additional layers 106, 108 may be sequentially formed above the depicted layer 108 in FIG. 2A.

Figure 2B:
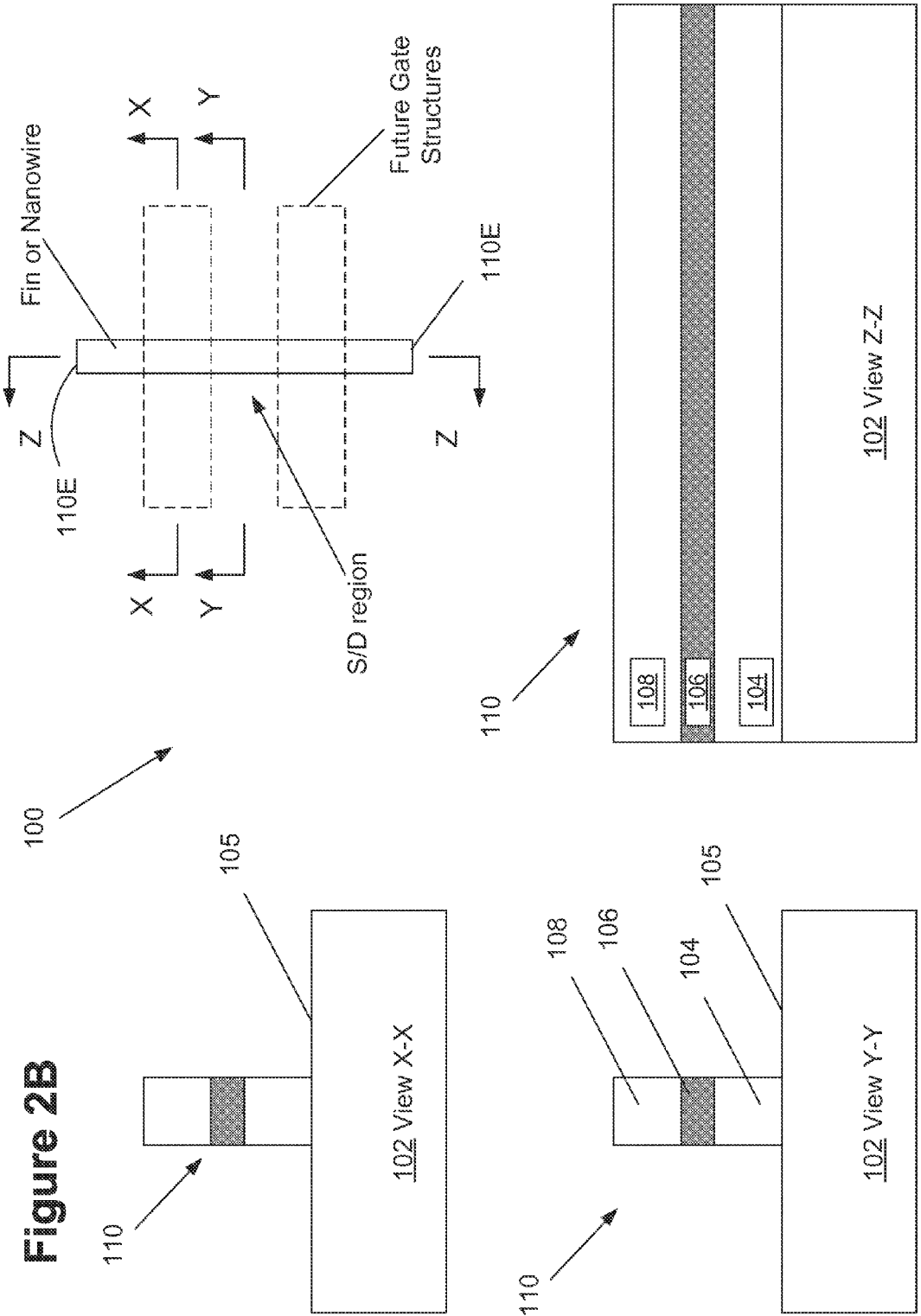

FIG. 2B depicts the FinFET or nanowire device 100 after one or more fin-defining etching processes, e.g., anisotropic etching processes, were performed through a patterned etch mask (not shown), such as a patterned hard mask layer, to define a plurality of trenches 105 in the substrate 102. The formation of the trenches 105 results in the formation of an illustrative substantially vertically oriented structure 110 comprised of portions of the layers 104, 106, and 108. Note that the structure 110 is unsupported in that its ends 110E (see plan view) are not in contact with another material, e.g., they are not in contact with an insulating material like in the example depicted in FIGS. 1K-1O discussed in the background section of this application. Eventually, thousands of transistor devices will be formed using parts of the structure 110 as channel regions and source/drain regions. That is, eventually thousands of gate structures will be formed across the structure 110, although only two such illustrative future gate structures are depicted in the simplistic plan view in FIG. 2B.

The overall size, shape and configuration of the trenches 105 and structure 110 may vary depending on the particular application. In the attached figures, the trenches 105 are depicted as having been formed by performing an anisotropic etching process that results in the trenches 105 having a schematically depicted, generally rectangular configuration. In an actual real-world device, the sidewalls of the trenches 105 may be somewhat inwardly tapered, although that configuration is not depicted in the attached drawings. In some cases, the trenches 105 may have a reentrant profile (not shown) near the bottom of the trenches 105. To the extent the trenches 105 are formed by performing a wet etching process, the trenches 105 may tend to have a more rounded configuration or non-linear configuration as compared to the generally rectangular configuration of the trenches 105 that are formed by performing an anisotropic etching process. Thus, the size and configuration of the trenches 105, and the manner in which they are made, as well as the general configuration of the fin 110, should not be considered a limitation of the present invention. For ease of disclosure, only the substantially rectangular trenches 105 and structure 110 will be depicted in the subsequent drawings. The width and height of the structure 110 as well as the depth of the trenches 105 may vary depending upon the particular application.

Figure 2C:
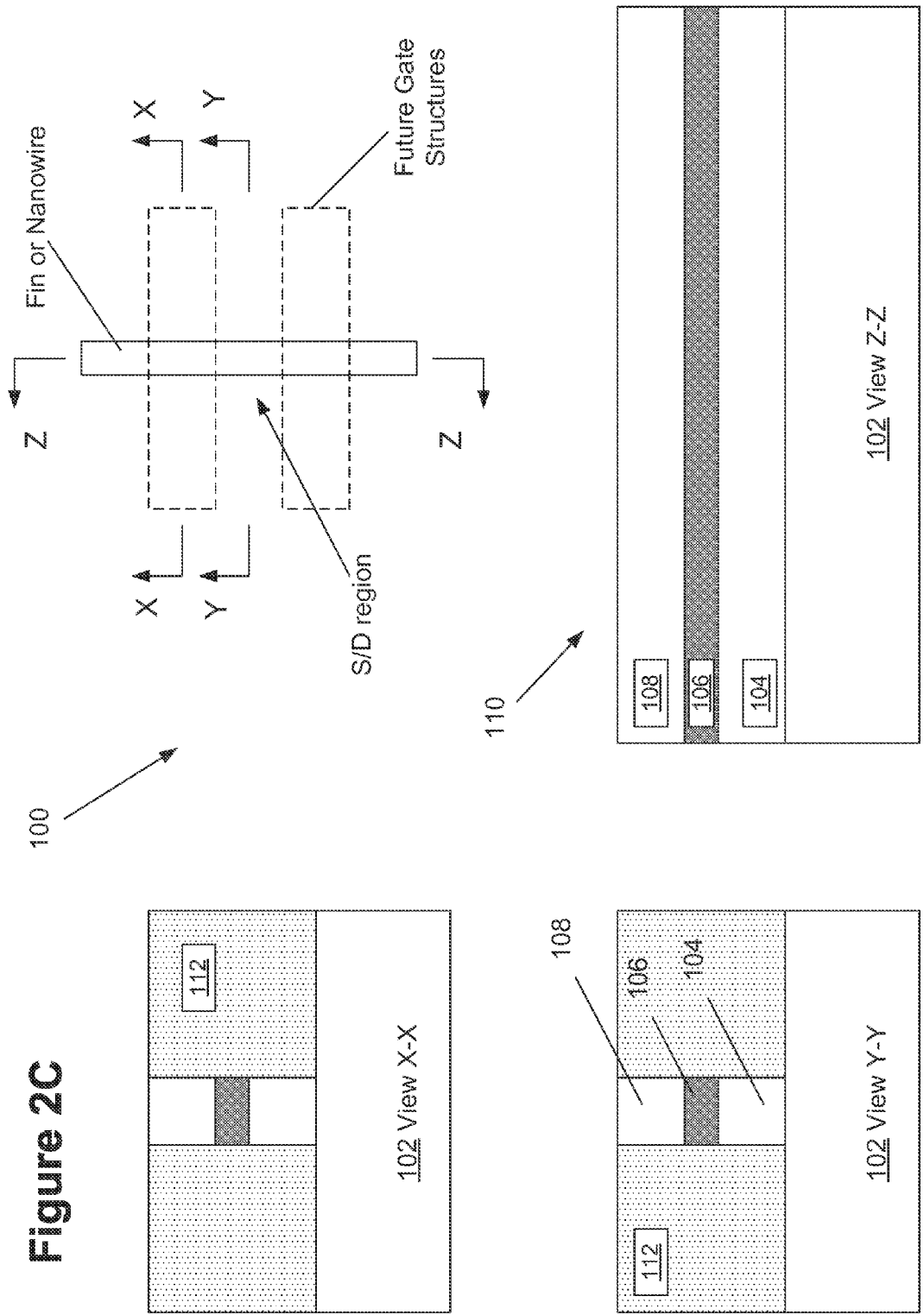

FIG. 2C depicts the FinFET or nanowire device 100 after a layer of insulating material 112 was formed on the device 100 so as to overfill the trenches 105 adjacent the structure 110, and after a chemical mechanical polishing (CMP) process was performed to planarize the upper surface of the layer of insulating material 112 with the upper surface of the third channel material layer 108. The layer of insulating material 112 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, ALD, etc.

Figure 2D:
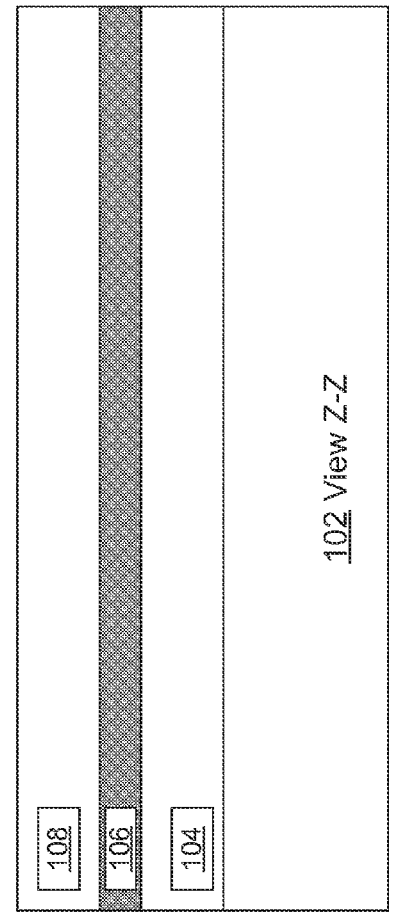
Figure 2D:
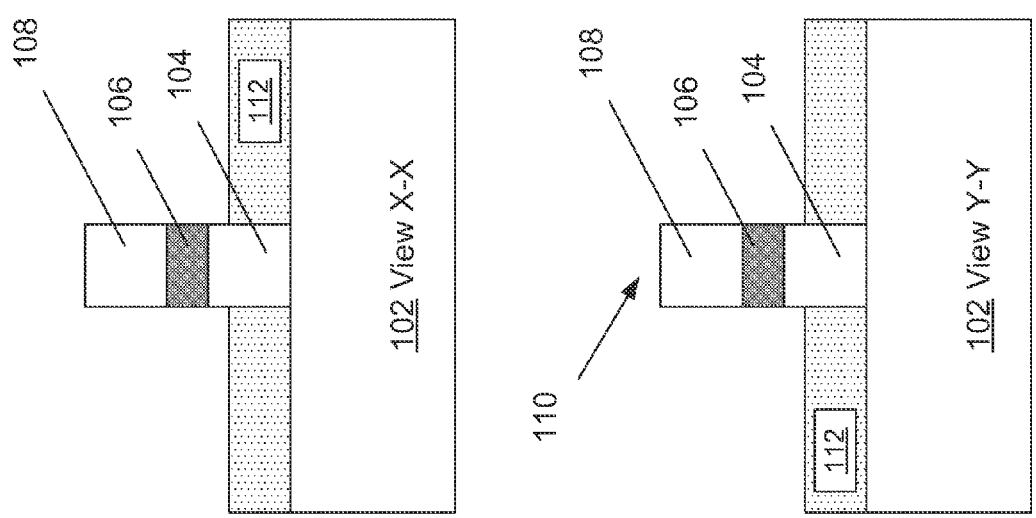

Next, as shown in FIG. 2D, the layer of insulating material 112 was recessed to a desired thickness such that the sacrificial second layer 106 was exposed.

FIG. 2E depicts the FinFET or nanowire device 100 after two illustrative dummy or sacrificial gate structures 114 were formed on the device 100 using well-known techniques. In one illustrative embodiment, the schematically depicted sacrificial gate structures 114 include an illustrative sacrificial gate insulation layer 114A and an illustrative sacrificial gate electrode 114B. An illustrative gate cap layer 116 (e.g., silicon nitride) may also be formed above the sacrificial gate electrode 114B. The sacrificial gate structures 114 and the gate cap layers 116 may all be formed using traditional manufacturing techniques. The sacrificial gate insulation layer 114A may be comprised of a variety of different materials, such as, for example, silicon dioxide, etc. Similarly, the sacrificial gate electrode 114B may also be made of a variety of materials, e.g., polysilicon, amorphous silicon, etc.

FIG. 2F depicts the FinFET or nanowire device 100 after sidewall spacers 120 were formed adjacent the sacrificial gate structures 114. The sidewall spacers 120 may be comprised of a variety of different materials, e.g., silicon nitride, and they may be formed by depositing a layer of spacer material and thereafter performing an anisotropic etching process. FIG. 2F also contains a side view of the device 100 from the source/drain area of the device. As depicted, the sidewall spacers 120 extend down to the upper surface of the recessed layer of insulating material 112. The location of the gate cap layer 116 is indicated by the dashed-line in this side-view drawing.

FIG. 2G depicts the FinFET or nanowire device 100 after one or more structure recess etching processes were performed to remove the third channel material layer 108 and the sacrificial second layer 106 from the structure 110 in the source/drain regions of the FinFET or nanowire device 100 so as to define source/drain cavities 140 and a recessed structure 110A in the source/drain regions that are free of the materials of the layers 106 and 108. Note that in the side-view drawing in FIG. 2G, the layers 106 and 108 are still shown, but they are positioned under the sidewall spacer 120.

FIG. 2H depicts the device 100 after an epitaxial growth process was performed to form epitaxial semiconductor material 122 in the source/drain regions on the exposed portions of the recessed structure 110A, i.e., the first (optional) layer 104 of semiconductor material 104. As depicted, the epitaxial semiconductor material 122 is formed such that is positioned between the spacers 120 on the sacrificial gate structures 114. The epitaxial semiconductor material 122 may be comprised of a variety of different semiconductor materials, and it may be formed in either a doped or undoped condition. The physical size, thickness and shape of the epitaxial semiconductor material 122 may vary depending upon the particular application. Note that, unlike the prior art processing technique illustrated in FIGS. 1R-1U, where epitaxial semiconductor material 37 is grown after the formation of the full dielectric isolation (FDI) device or the partial dielectric isolation (PDI) device is formed, the epitaxial material 122 grown in the cavities 140 is grown on continuous surfaces made of semiconductor materials (e.g., silicon or silicon-germanium), i.e., all of the layers 104, 106, 108 are exposed in the cavities 140 and they serve as growth surfaces for the epi material 122. That is, the insulation material 25 that is part of the exposed surfaces in the cavities 35 discussed in the background section of this application is not present in the cavities 140, since the sacrificial material 106 has not yet been removed from under the gate structures. Thus, the epitaxial semiconductor material 122 formed using the methods disclosed herein will be of better quality and have fewer defects as compared to the epitaxial material 37 grown from separated surfaces, e.g., the surfaces 21X, in the presence of the insulation material 25 that is present in the cavities 35 using the above-described prior art techniques.

If desired, prior to the formation of the epi semiconductor material 122, a liner epitaxy layer 142, indicated in dashed lines in FIG. 2H may be formed on the exposed portions of the layers 104, 106, 108 after the structure recessing process was performed. One purpose of liner layer 142 is to protect the epi semiconductor material 122 when removing the sacrificial layer 106 from underneath the gate structure, as will be discussed further below. By forming the liner layer 142 before the epi material 122 is formed, there may be even less chance of defects since the epi semiconductor material 122 will be formed on the liner layer 142 (which is a single material with a composition closer to the layers 104, 106, 108) instead of being formed by growth from different semiconductor materials, i.e., the layers 104, 106, 108. The liner layer 142 may be comprised of a layer of material such as silicon germanium or silicon, and it may be formed by performing an epi deposition process. In one example for a PFET device, where the optional layer 104 and channel material 108 is made of $SiGe_{0.50}$, the sacrificial layer 106 may be made of silicon, the source/drain epi layer 122 may be made of $SiGe_{0.75}$ or substantially pure germanium, the liner layer 142 may be made of $SiGe_{0.50}$ or a silicon germanium material having a lower germanium content. The liner layer 142 may be formed to any desired thickness, e.g., 1-5 nm.

Figure 2I:
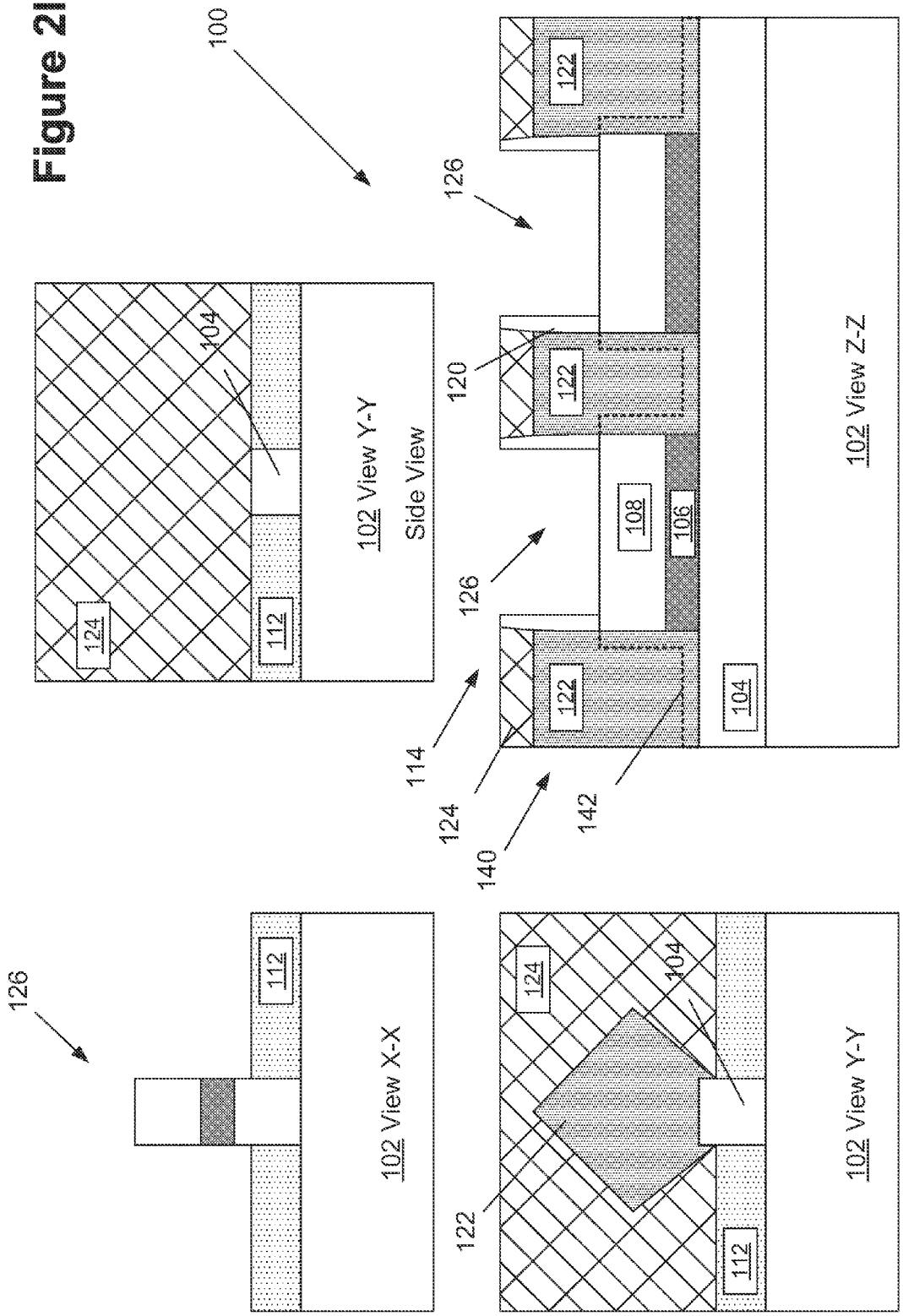

FIG. 2I depicts the FinFET or nanowire device 100 after several process operations were performed. First, a layer of insulating material 124 was formed on the device 100 so as to overfill the spaces between the sacrificial gate structures 114. The layer of insulating material 124 may be comprised of the same material as that of the layer of insulating material 112 described above, or it may be comprised of a different material. Next, one or more chemical mechanical polishing (CMP) processes were performed to planarize the upper surface of the layer of insulating material 124 and remove the gate cap layers 116, thereby exposing the gate electrode structures 114B of the sacrificial gate structures 114. Then, one or more etching processes were performed to remove the sacrificial gate structures 114, i.e., the gate electrode 114B and the gate insulation 114A, relative to the surrounding structures. This results in the formation of replacement gate cavities 126 between the spacers 120 and the exposure of the third channel material layer 108, the sacrificial second layer 106 and portions of the optional layer 104 within the gate cavities 126.

FIG. 2J depicts the FinFET or nanowire device 100 after a timed, wet etching process was performed through the gate cavities 126 to remove the portions of the sacrificial second layer 106 of semiconductor material selectively relative to the surrounding structures, i.e., selectively relative to the semiconductor material layers 104, 108, the sidewall spacers 120 and the epi semiconductor material 122 formed in the source/drain regions of the device 100. This process results in the formation of a gap 128 in the areas formerly occupied by the removed portions of the sacrificial second layer 106. Note that, unlike the prior art methods described in the background section of this application, using the methods disclosed herein, at the time the portion of the sacrificial second layer 106 depicted in FIG. 2J was removed, the remaining portion of the third channel material layer 108 is supported by the sidewall spacers 120 and the previously formed epitaxial semiconductor materials 122 in the source/drain regions of the device. These supporting structures act to retain the strain imparted to the third channel material layer 108 that will function as the strained channel region for the FinFET or nanowire device 100. Also note that, unlike the prior art methods, the entire length of the sacrificial second layer 106 is not removed. Rather, the portions of the sacrificial second layer 106 that are positioned outside of the spacers 120 in the source/drain regions of the device 100 are not removed prior to the formation of the epitaxial semiconductor material 122.

Figure 1D:
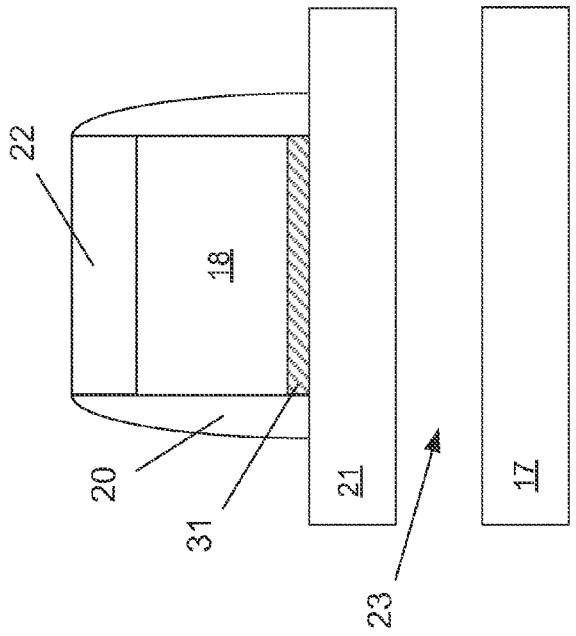
Figure 1C:
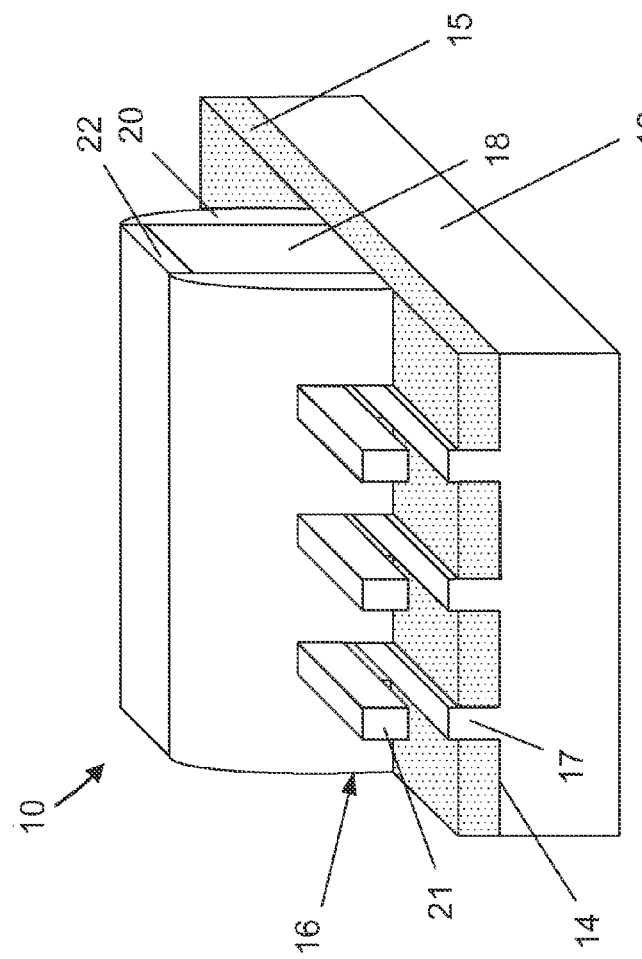
Figure 1F:
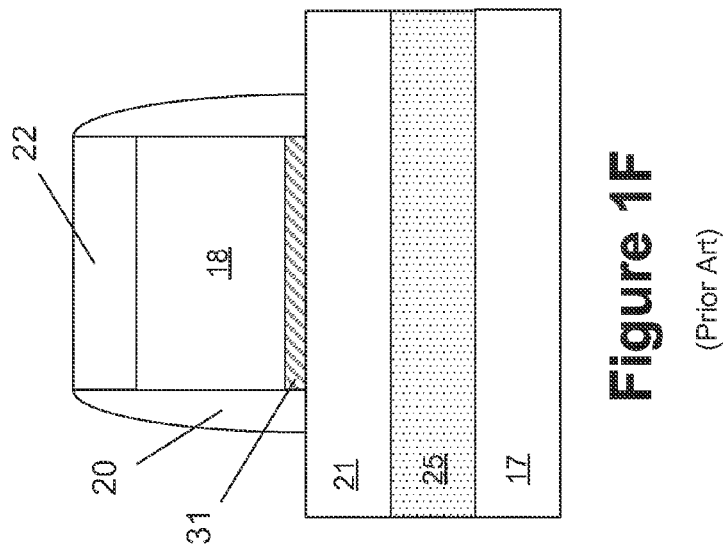
Figure 1E:
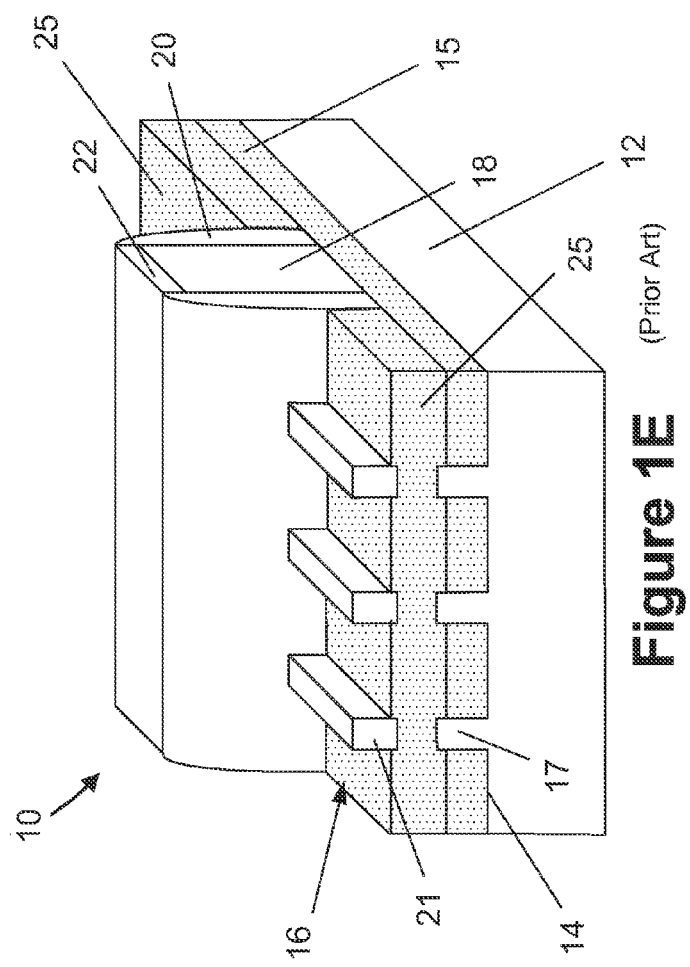
Figure 1K:
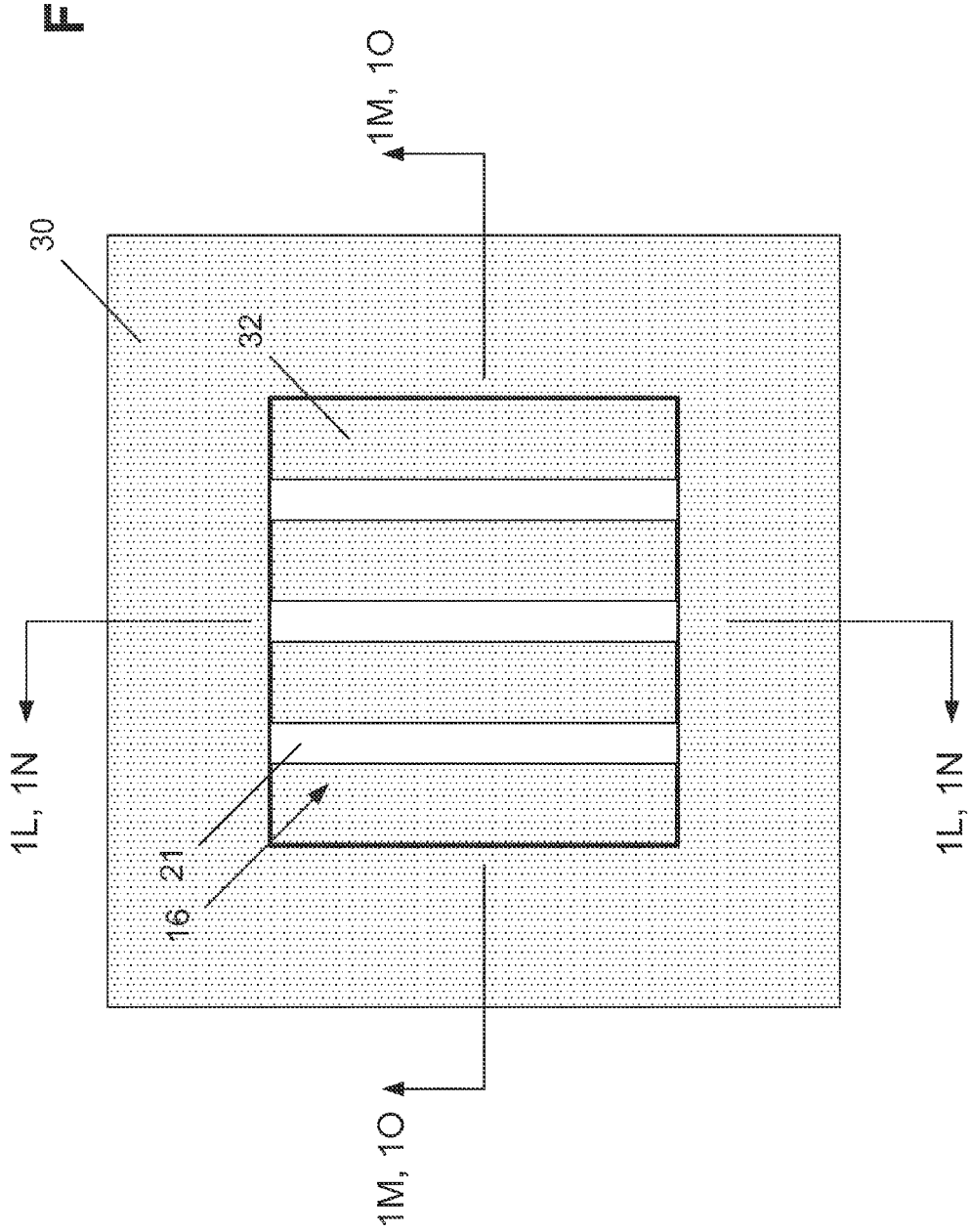
Figure 1N:
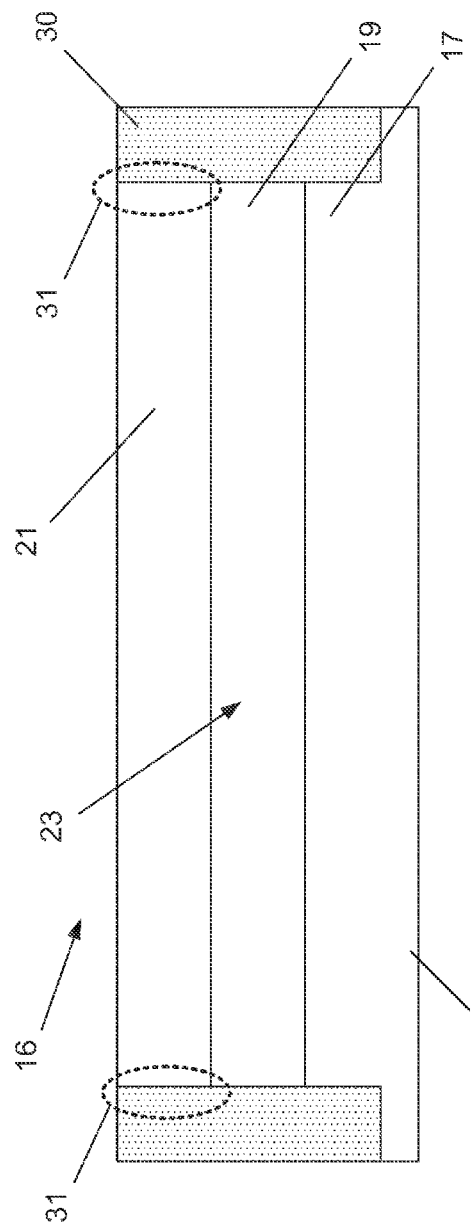
Figure 1O:
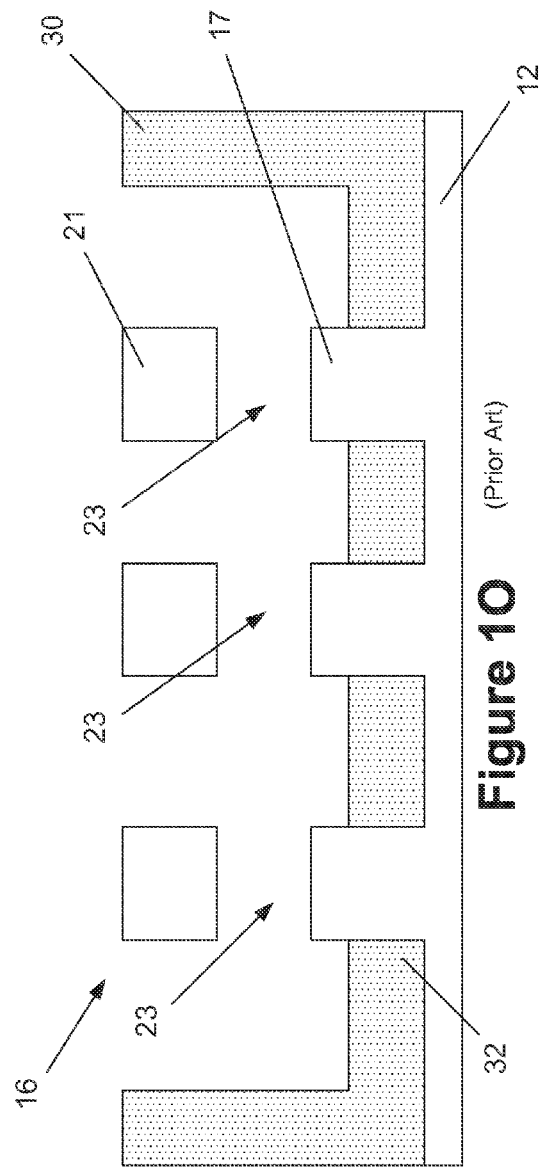

FIG. 2K depicts the FinFET or nanowire device 100 after a conformal deposition process was performed through the gate cavities 126 to fill the gaps 128 with an insulating material 130, such as silicon dioxide. After the deposition process was performed, an anisotropic etching process may be performed to remove portions of the insulating material 130 not positioned under the third channel material layer 108 within the gate cavities 126. Unlike the prior art technique where the gate structures were formed prior to removal of the sacrificial material layer, wherein the dielectric deposition process was performed using a "tunnel fill" technique (see, e.g., FIGS. 1D and 1H) to form the insulating material in the gap 23 under the gate structure, the conformal deposition disclosed herein fills the gap 128 from two sides of the fin 108, thus there is less chance for incomplete filling of the gap 128, i.e., there is less chance for the formation of holes or voids in the insulating material 130.

FIG. 2L depicts the FinFET or nanowire device 100 after illustrative, and schematically depicted final gate structures 132 are formed on the device 100 using well-known replacement gate manufacturing techniques. Also depicted is an illustrative gate cap layer 134, e.g., silicon nitride. In one illustrative embodiment, the schematically depicted final gate structure 132 includes an illustrative gate insulation layer (not separately shown) and one or more metal layers (not separately shown) that function as the gate electrode. The gate insulation layer may be comprised of a variety of different materials, such as, for example, silicon dioxide, a so-called high-k (k value greater than 10) insulation material (where k is the relative dielectric constant), etc. As will be recognized by those skilled in the art after a complete reading of the present application, the final gate structure, i.e., the gate insulation layer and the gate electrode, is intended to be representative in nature. That is, the final gate structure 132 may be comprised of a variety of different materials and it may have a variety of configurations. At the point of fabrication depicted in FIG. 2L, traditional manufacturing techniques may be performed to complete the manufacture of the device 100. For example, contacts and metallization layers may be formed above the device 100 using traditional techniques.

FIG. 2M depicts an alternative process flow for forming the device disclosed herein. In this embodiment, the structure 110 is not recessed in the source/drain regions after the sacrificial gates structures 114 and sidewall spacers 120 are formed, i.e., the cavities 140 are not formed. Otherwise the processing remains the same.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor device comprised of source/drain regions and a channel region, the method, comprising:
    forming a sacrificial gate structure above a substantially vertically oriented structure, said structure extending across said source/drain regions and said channel region and comprising a first sacrificial semiconductor material and a second semiconductor material positioned above said first sacrificial semiconductor material;
    forming a sidewall spacer adjacent said sacrificial gate structure;
    after forming said sidewall spacer, forming epi semiconductor material in said source/drain regions;
    performing at least one etching process to remove said sacrificial gate structure so as to define a replacement gate cavity and to expose at least said first and second semiconductor materials within said gate cavity;
    with said epi semiconductor material in position in said source/drain regions, performing an etching process through said replacement gate cavity to selectively remove said exposed first sacrificial semiconductor material within said gate cavity relative to said exposed second semiconductor material so as to define a gap under said second semiconductor material within said gate cavity;
    filling said gap with an insulating material; and
    forming a replacement gate structure in said gate cavity around at least a portion of said second semiconductor material.

2. The method of claim 1, wherein said transistor device is one of a FinFET device and a nanowire device.

3. The method of claim 1, wherein said first sacrificial semiconductor material is silicon-germanium ($SiGe_{0.50}$) and said second semiconductor material is silicon.

4. The method of claim 1, wherein said first sacrificial semiconductor material is silicon and said second semiconductor material is silicon-germanium ($SiGe_{0.50}$).

5. The method of claim 1, wherein said replacement gate structure is comprised of a high-k gate insulation layer and a gate electrode comprised of at least one layer of metal.

6. The method of claim 1, wherein said device is a nanowire transistor device and wherein forming said replacement gate structure in said gate cavity comprises forming said replacement gate structure around the entire second semiconductor material.

7. The method of claim 1, wherein forming said epi semiconductor material in said source/drain regions comprises forming said epi semiconductor material on the portions of said structure that extend across said source/drain regions.

8. The method of claim 1, wherein, prior to forming said epi semiconductor material in said source/drain regions, the method comprises performing at least one etching process to remove said first and second semiconductor materials from above said source/drain regions so as to thereby define recessed cavities in said source/drain regions and thereafter forming said epi semiconductor material in said recessed cavities in said source/drain regions.

9. The method of claim 8, wherein, prior to forming said epi semiconductor material in said recessed cavities in said source/drain regions, the method comprises forming a liner layer comprised of a semiconductor material on at least said first and second semiconductor materials exposed by the formation of said cavities and thereafter forming said epi semiconductor material in said cavities and in contact with said liner layer.

10. The method of claim 1, wherein, after forming said sidewall spacers, the method comprises performing at least one etching process to remove said first and second semiconductor materials from above said source/drain regions so as to define a recessed structure and thereafter forming said epi semiconductor material in said source/drain regions on said recessed structure.

11. The method of claim 1, wherein, after forming said sidewall spacers, the method comprises:
    performing at least one etching process to remove said first and second semiconductor materials from above said source/drain regions so as to define a recessed structure in said source/drain regions;
    forming a liner layer comprised of a semiconductor material on said recessed structure; and
    forming said epi semiconductor material in said source/drain regions on said liner layer.

12. The method of claim 1, wherein filling said gap with said insulating material comprises performing a conformal deposition process through said replacement gate cavity to fill said gap with said insulating material.

13. The method of claim 1, wherein the method further comprises forming said substantially vertically oriented structure by:
    forming a layer of said first sacrificial semiconductor material above said substrate;
    forming a layer of said second semiconductor material on said first layer of sacrificial semiconductor material;
    forming a patterned masking layer above said second layer of semiconductor material; and
    performing at least one etching process through said patterned masking layer to remove exposed portions of said first and second semiconductor materials so as to thereby define said structure that is unsupported at its ends.

14. A method of forming a plurality of transistor devices, each of which is comprised of source/drain regions and a channel region, the method, comprising:
    forming a substantially vertically oriented structure above a substrate, said structure being unsupported at its ends in that its ends are not in contact with another material, said structure extending across said source/drain regions and said channel regions of said devices, said structure comprising a first sacrificial semiconductor material and a second semiconductor material positioned above said first sacrificial semiconductor material;
    forming a plurality of sacrificial gate structures above said unsupported structure;
    forming a sidewall spacer adjacent each of said plurality of sacrificial gate structures;
    after forming said sidewall spacers, forming epi semiconductor material in said source/drain regions for each of said devices;

performing at least one etching process to remove said sacrificial gate structures so as to define a replacement gate cavity for each of said devices and to expose at least said first and second semiconductor materials within each of said gate cavities;

with said epi semiconductor material in position in said source/drain regions, performing an etching process through said replacement gate cavities to selectively remove said exposed first sacrificial semiconductor material within said gate cavities relative to said exposed second semiconductor material so as to define a gap under said second semiconductor material within each of said gate cavities;

performing a conformal deposition process through each of said replacement gate cavities to fill said gap with an insulating material; and forming a replacement gate structure in each of said gate cavities around at least a portion of said second semiconductor material.

15. The method of claim 14, wherein said first sacrificial semiconductor material is silicon-germanium ($SiGe_{0.50}$) and said second semiconductor material is silicon.

16. The method of claim 14, wherein said first sacrificial semiconductor material is silicon and said second semiconductor material is silicon-germanium ($SiGe_{0.50}$).

17. The method of claim 14, wherein forming said epi semiconductor material in said source/drain regions comprises forming said epi semiconductor material on the portions of said structure that extend across said source/drain regions.

18. The method of claim 14, wherein, prior to forming said epi semiconductor material in said source/drain regions, the method comprises performing at least one etching process to remove said first and second semiconductor materials from above said source/drain regions so as to thereby define recessed cavities in said source/drain regions of said devices and thereafter forming said epi semiconductor material in said recessed cavities in said source/drain regions of said transistor devices.

19. The method of claim 18, wherein, prior to forming said epi semiconductor material in said recessed cavities in said source/drain regions, the method comprises forming a liner layer comprised of a semiconductor material on at least said first and second semiconductor materials exposed by the formation of said recessed cavities and thereafter forming said epi semiconductor material in said recessed cavities and in contact with said liner layer.

20. The method of claim 14, wherein, after forming said sidewall spacers, the method comprises performing at least one etching process to remove said first and second semiconductor materials from above said source/drain regions so as to define a recessed structure and thereafter forming said epi semiconductor material in said source/drain regions on said recessed structure.

21. The method of claim 14, wherein, after forming said sidewall spacers, the method comprises:

performing at least one etching process to remove said first and second semiconductor materials from above said source/drain regions so as to define a recessed structure in said source/drain regions;

forming a liner layer comprised of a semiconductor material on said recessed structure; and forming said epi semiconductor material in said source/drain regions on said liner layer.

* * * * *